United States Patent
Nienhuys et al.

(10) Patent No.: US 11,175,596 B2
(45) Date of Patent: Nov. 16, 2021

(54) PARTICLE TRAPS AND BARRIERS FOR PARTICLE SUPPRESSION

(71) Applicants: ASML Netherlands B.V., Veldhoven (NL); ASML Holding N.V., Veldhoven (NL)

(72) Inventors: Han-Kwang Nienhuys, Utrecht (NL); Ronald Peter Albright, Norwalk, CT (US); Jacob Brinkert, Schalkhaar (NL); Yang-Shan Huang, Veldhoven (NL); Hendrikus Gijsbertus Schimmel, Utrecht (NL); Antonie Hendrik Verweij, Dussen (NL)

(73) Assignees: ASML Netherlands B.V., Veldhoven (NL); ASML Holding N.V., Veldhoven (NL)

(*) Notice: Subject to any disclaimer, the term of this patent is extended or adjusted under 35 U.S.C. 154(b) by 19 days.

(21) Appl. No.: 16/633,419

(22) PCT Filed: Jul. 18, 2018

(86) PCT No.: PCT/EP2018/069463
§ 371 (c)(1),
(2) Date: Jan. 23, 2020

(87) PCT Pub. No.: WO2019/020445
PCT Pub. Date: Jan. 31, 2019

(65) Prior Publication Data
US 2020/0225591 A1 Jul. 16, 2020

Related U.S. Application Data

(60) Provisional application No. 62/538,198, filed on Jul. 28, 2017.

(51) Int. Cl.
*G03F 7/20* (2006.01)
*B01D 45/08* (2006.01)
*B01D 45/10* (2006.01)

(52) U.S. Cl.
CPC ........ *G03F 7/70916* (2013.01); *B01D 45/08* (2013.01); *B01D 45/10* (2013.01); *G03F 7/70716* (2013.01)

(58) Field of Classification Search
CPC . G03F 7/70916; G03F 7/70716; B01D 45/08; B01D 45/10
(Continued)

(56) References Cited

U.S. PATENT DOCUMENTS 9,081,311 B2 * 7/2015 Vogel .................. G03F 7/70908
2002/0096647 A1 7/2002 Moors et al.
(Continued)

FOREIGN PATENT DOCUMENTS

EP 1510669 A1 * 3/2005 ............ F01N 3/035
JP H09-22870 A 1/1997
(Continued)

OTHER PUBLICATIONS

International Search Report and Written Opinion of the International Searching Authority directed to related International Patent Application No. PCT/EP2018/069463, dated Nov. 9, 2018; 11 pages.
(Continued)

*Primary Examiner* — Hung Nguyen
(74) *Attorney, Agent, or Firm* — Sterne, Kessler, Goldstein & Fox P.L.L.C.

(57) ABSTRACT

Designs are provided to reduce the possibility of contaminant particles with a large range of sizes, materials, travel speeds and angles of incidence reaching a particle-sensitive environment. According to an aspect of the disclosure, there
(Continued)

is provided an object stage comprising first and second chambers, a first structure having a first surface, and a second structure. The second structure is configured to support an object in the second chamber, movable relative to the first structure. The second structure comprises a second surface opposing the first surface of the first structure thereby defining a gap between the first structure and the second structure that extends between the first chamber and the second chamber. The second structure further comprises a third surface within the first chamber. The object stage further comprises a trap disposed on at least a portion of the third surface, the trap comprising a plurality of baffles.

26 Claims, 18 Drawing Sheets

(58) Field of Classification Search
USPC .................................................. 355/30, 72–76
See application file for complete search history.

(56) References Cited

U.S. PATENT DOCUMENTS

| 2007/0079525 | A1* | 4/2007 | Sogard ...................... G03F 1/82 |
| | | | 34/275 |
| 2009/0073401 | A1 | 3/2009 | Buis et al. |
| 2010/0271606 | A1 | 10/2010 | Sanderse et al. |
| 2012/0249983 | A1 | 10/2012 | Vogel et al. |

FOREIGN PATENT DOCUMENTS

| JP | 2007-189073 A | 7/2007 |
| WO | WO 2018/019626 A | 2/2018 |

OTHER PUBLICATIONS

International Preliminary Report on Patentability directed to related International Patent Application No. PCT/EP2018/069463, dated Jan. 28, 2020; 8 pages.

* cited by examiner

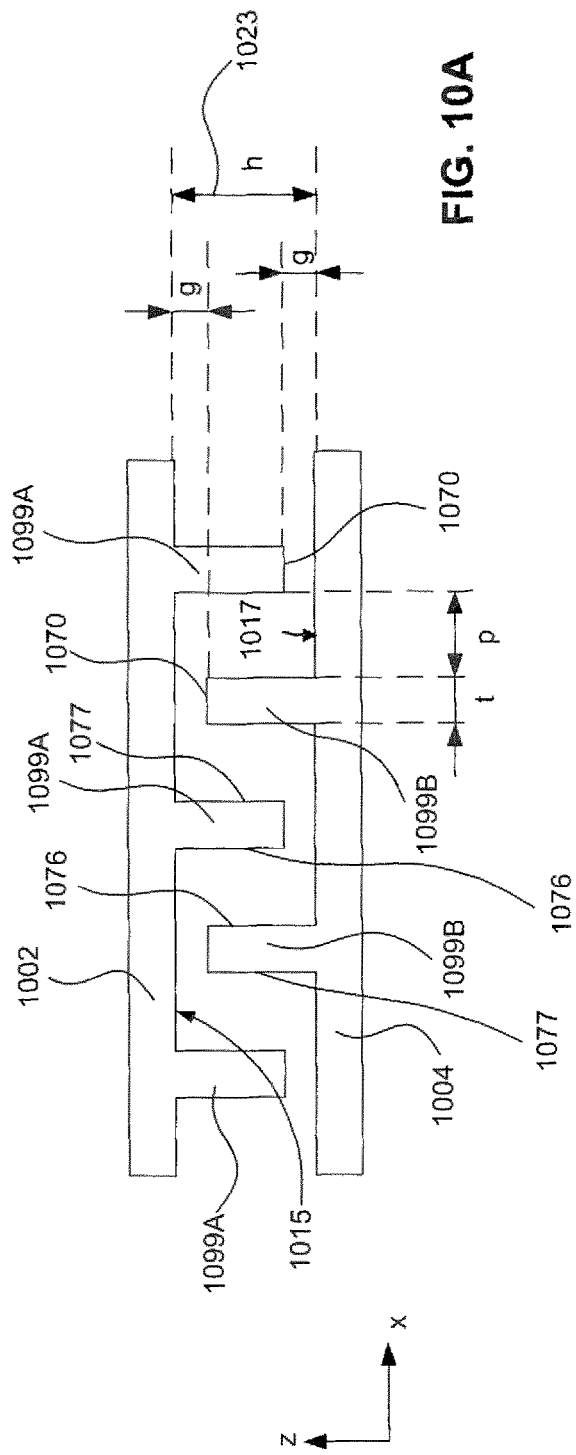
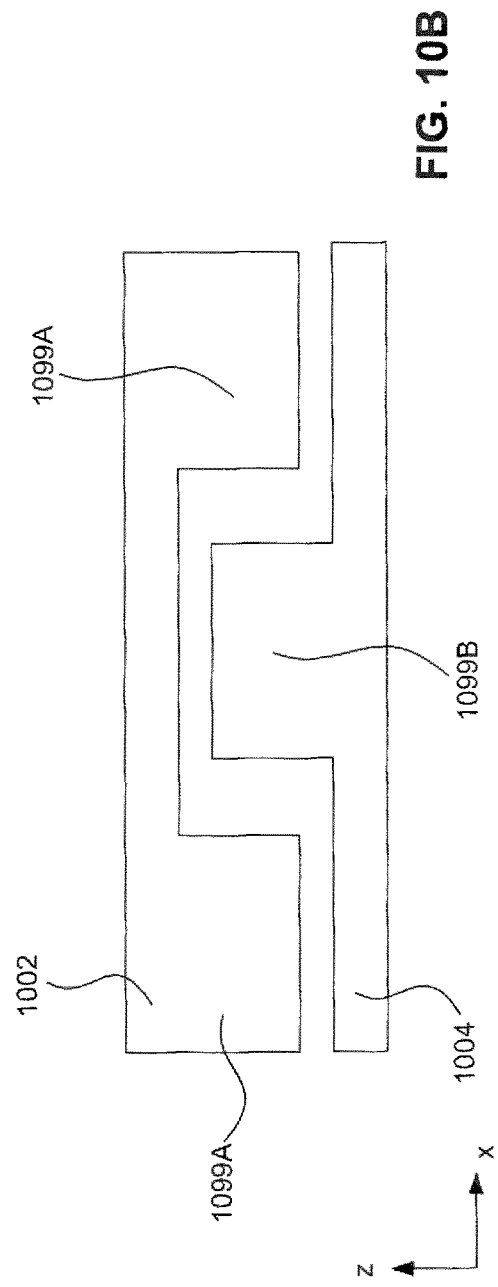

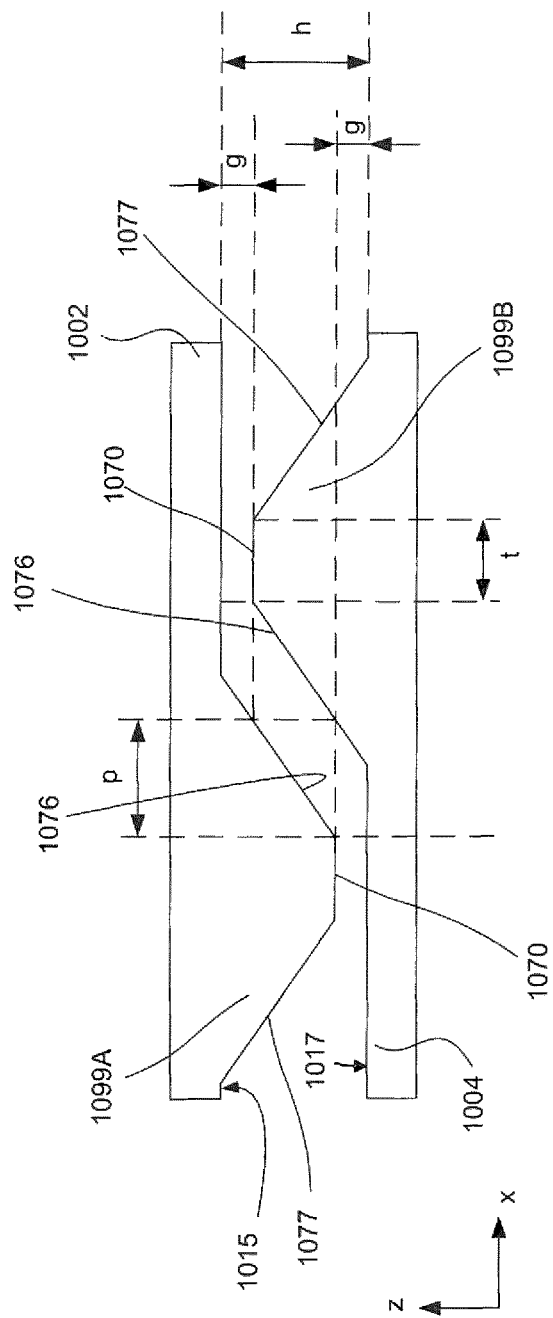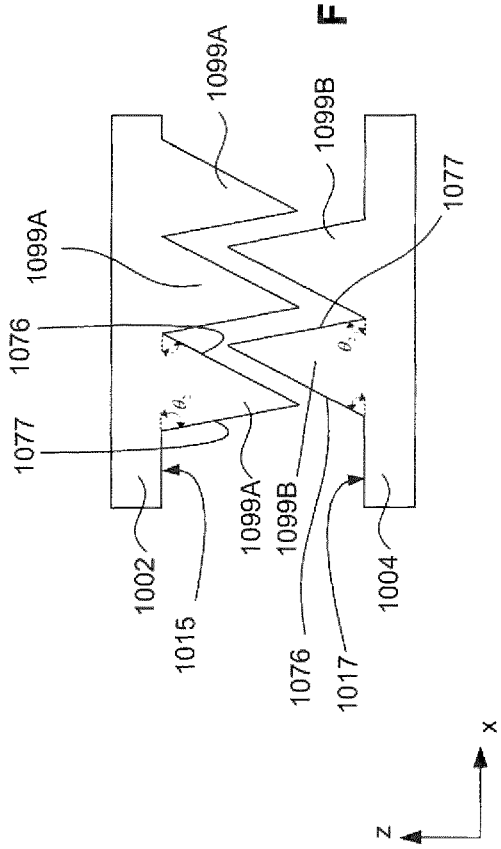
FIG. 10C
FIG. 10D

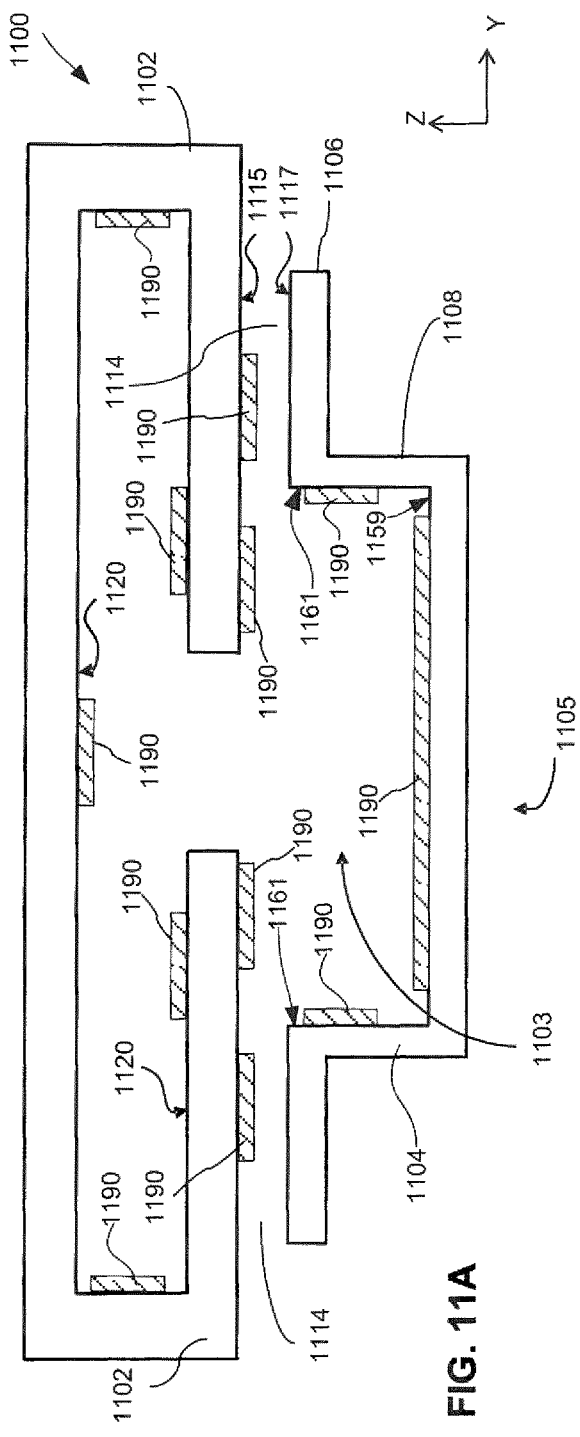
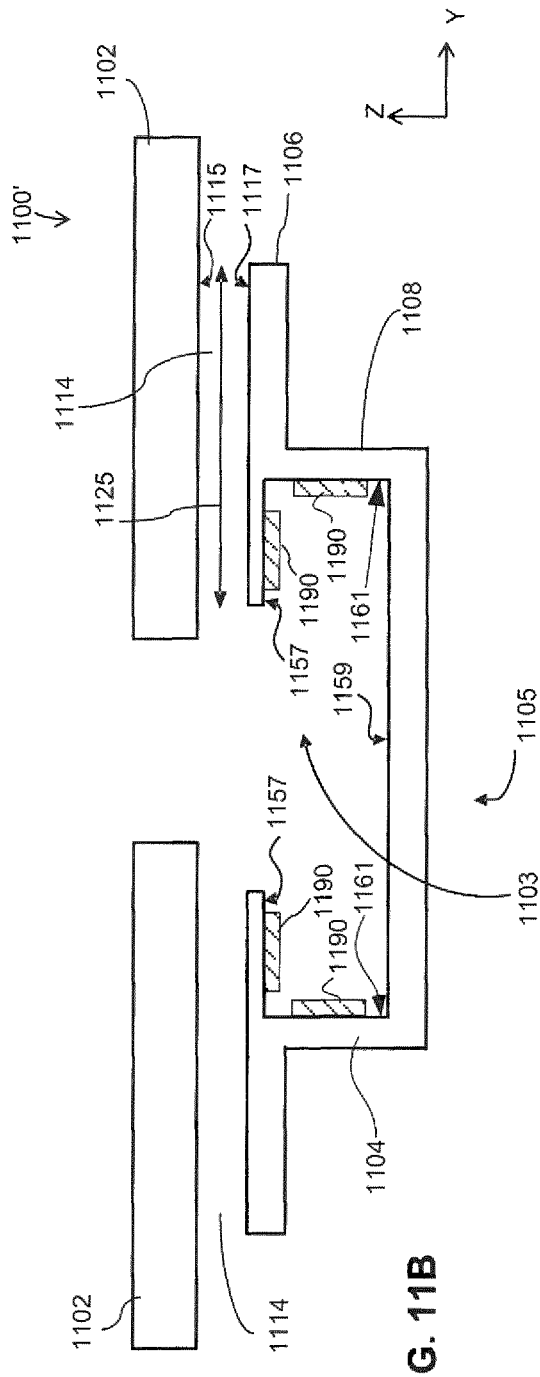
FIG. 11A
FIG. 11B

PARTICLE TRAPS AND BARRIERS FOR PARTICLE SUPPRESSION

CROSS-REFERENCE TO RELATED APPLICATIONS

This application claims priority of U.S. Provisional Patent Application No. 62/538,198, which was filed on Jul. 28, 2017, and which is incorporated herein in its entirety by reference.

FIELD

The present disclosure relates to particle suppression using, for example, particle traps and particle barriers in, for example, lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. The patterning device can be held in a vacuum environment. Within this vacuum environment, there can be contaminant particle sources, for example, cables or cable and hose carriers, which can generate contaminant particles. If these contaminant particles reach the patterning device and/or regions near the patterning device, defects in the formed image may occur.

SUMMARY OF THE DISCLOSURE

Accordingly, there is a need to reduce the possibility of contaminant particles with a large range of sizes, materials, travel speeds and angles of incidence reaching a particle-sensitive environment.

According to an aspect of the disclosure, there is provided an object stage comprising a first chamber and a second chamber. The object stage further comprises a first structure having a first surface and a second structure. The second structure is configured to support an object in the second chamber, movable relative to the first structure. The second structure comprises a second surface opposing the first surface of the first structure thereby defining a gap between the first structure and the second structure that extends between the first chamber and the second chamber. The second structure further comprises a third surface within the first chamber. The object stage further comprises a trap disposed on at least a portion of the third surface, the trap comprising a plurality of baffles configured to restrain contaminant particles from passing through the gap.

According to an aspect of the disclosure, there is provided a lithographic apparatus configured to transfer a pattern from a patterning device onto a substrate. The lithographic apparatus comprises a substrate table configured to hold and move the substrate along a scanning direction and a reticle stage configured to hold and move the reticle. The reticle stage comprises a first chamber and a second chamber. The reticle stage further comprises a first structure having a first surface and a second structure. The second structure is configured to support the reticle in the second chamber, movable relative to the first structure. The second structure comprises a second surface opposing the first surface of the first structure thereby defining a gap between the first structure and the second structure that extends between the first chamber and the second chamber. The second structure further comprises a third surface within the first chamber. The reticle stage further comprises a trap disposed on at least a portion of the third surface, the trap comprising a plurality of baffles configured to restrain contaminant particles from passing through the gap.

According to an aspect of the disclosure, there is provided an object stage comprising a first chamber and a second chamber. The object stage further comprises a first structure having a first surface and a second structure configured to support an object in the second chamber, movable relative to the first structure. The second structure comprises a second surface opposing the first surface of the first structure thereby defining a gap between the first structure and the second structure that extends between the first chamber and the second chamber. The object stage further comprises a barrier disposed in the gap, and configured to restrain contaminant particles from passing through the gap.

According to an aspect of the disclosure, there is provided a lithographic apparatus configured to transfer a pattern from a patterning device onto a substrate. The lithographic apparatus comprises a substrate table configured to hold and move the substrate along a scanning direction and a reticle stage configured to hold and move the reticle. The reticle stage comprises a first chamber and a second chamber. The reticle stage further comprises a first structure having a first surface and a second structure configured to support the reticle in the second chamber, movable relative to the first structure. The second structure comprises a second surface opposing the first surface of the first structure thereby defining a gap between the first structure and the second structure that extends between the first chamber and the second chamber. The reticle stage further comprises a barrier disposed in the gap, and configured to restrain contaminant particles from passing through the gap.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art(s) to make and use the invention.

FIGS. 10A-10D schematically depict, in cross section, exemplary interdigitated projecting baffles of baffle particle barriers, according to various embodiments of this disclosure.

FIGS. 11A and 11B schematically depict, in cross-section, various configurations of apparatuses having particle traps for particle suppression, according to various embodiments of the disclosure.

Figure 1A:
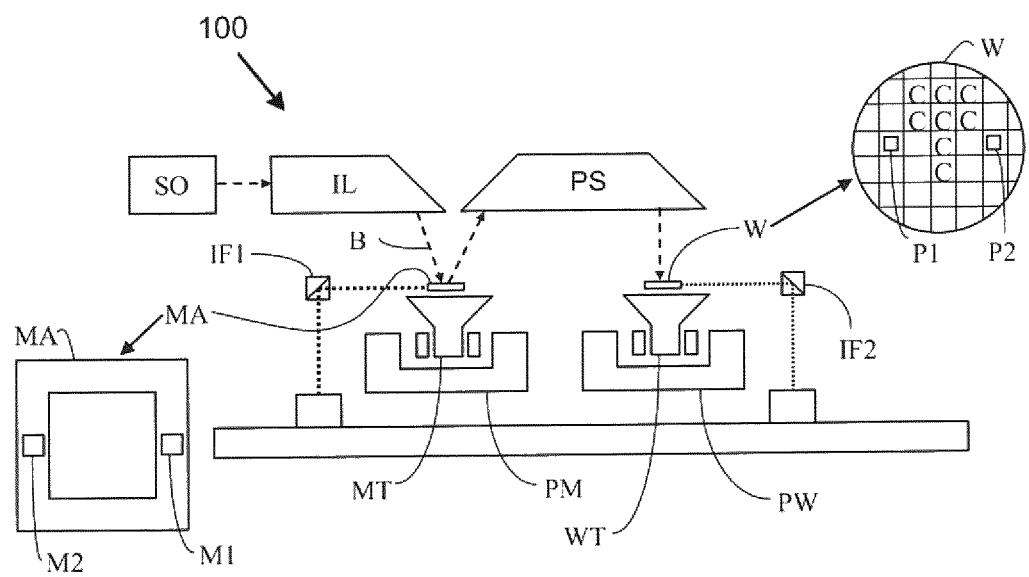
FIG. 1A is a schematic illustration of a reflective lithographic apparatus according to an embodiment of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," "exemplary," "example," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present disclosure may be implemented.

Exemplary Reflective and Transmissive Lithographic Systems

Figure 1B:
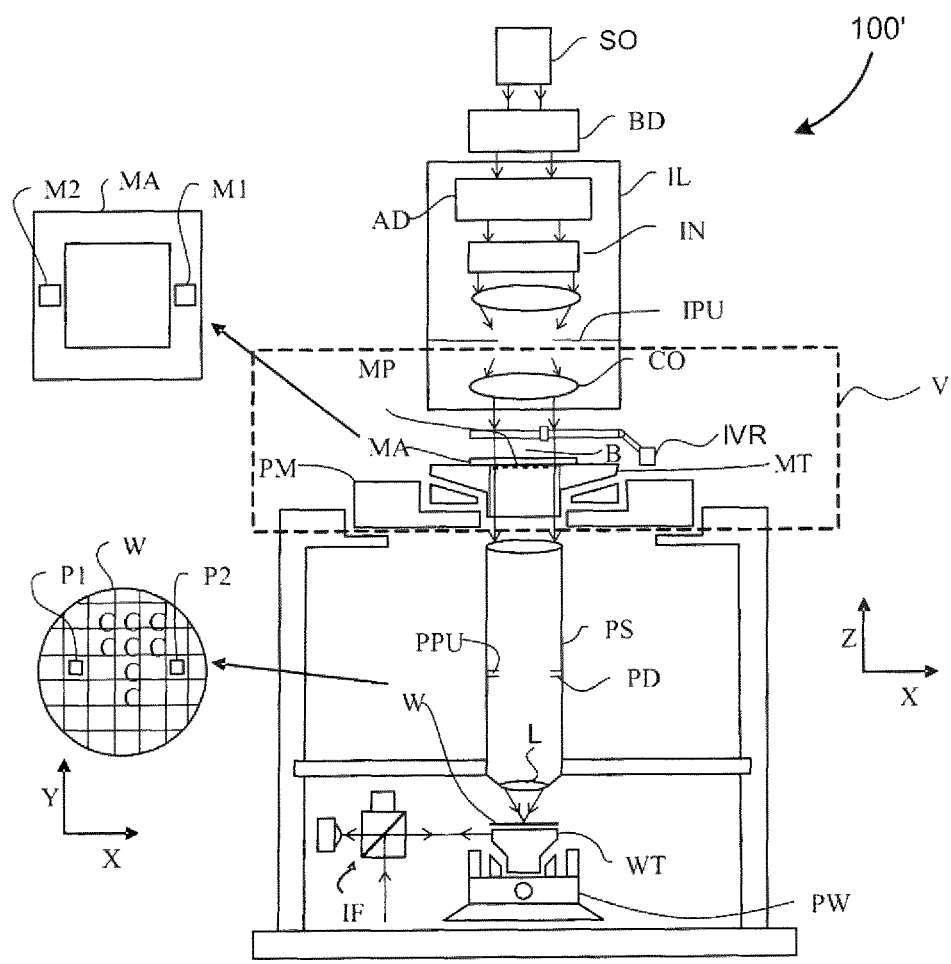
FIG. 1B is a schematic illustration of a transmissive lithographic apparatus according to an embodiment of the disclosure.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a reticle stage or a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, a reticle stage or mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, a reticle stage or mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the reticle stage or mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the reticle stage or mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Reticle stage or mask table MT and patterning device MA can be in a vacuum chamber, where an in-vacuum robot IVR can be used to move patterning devices such as a mask or a reticle in and out of vacuum chamber. Alternatively, when reticle stage or mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, reticle stage or mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, reticle stage or mask table) MT and the substrate table WT are scanned synchronously while a pattern imparted to the radiation beam B is projected onto a target portion C (i.e., a single dynamic exposure). The velocity and direction of the substrate table WT relative to the support structure (for example, reticle stage or mask table) MT can be determined by the (de-)magnification and image reversal characteristics of the projection system PS.

3. In another mode, the support structure (for example, reticle stage or mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
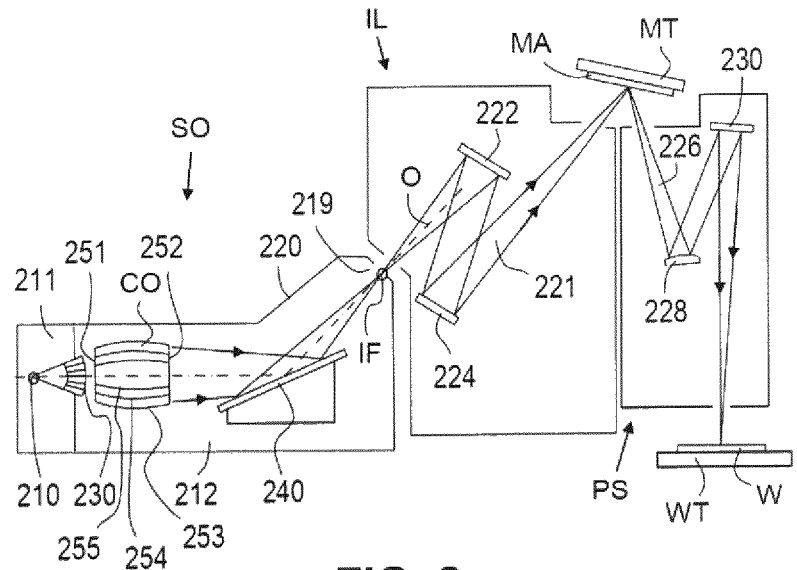
FIG. 2 is a more detailed schematic illustration of the reflective lithographic apparatus, according to an embodiment of the disclosure.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGS. for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Lithographic Cells

Figure 3:
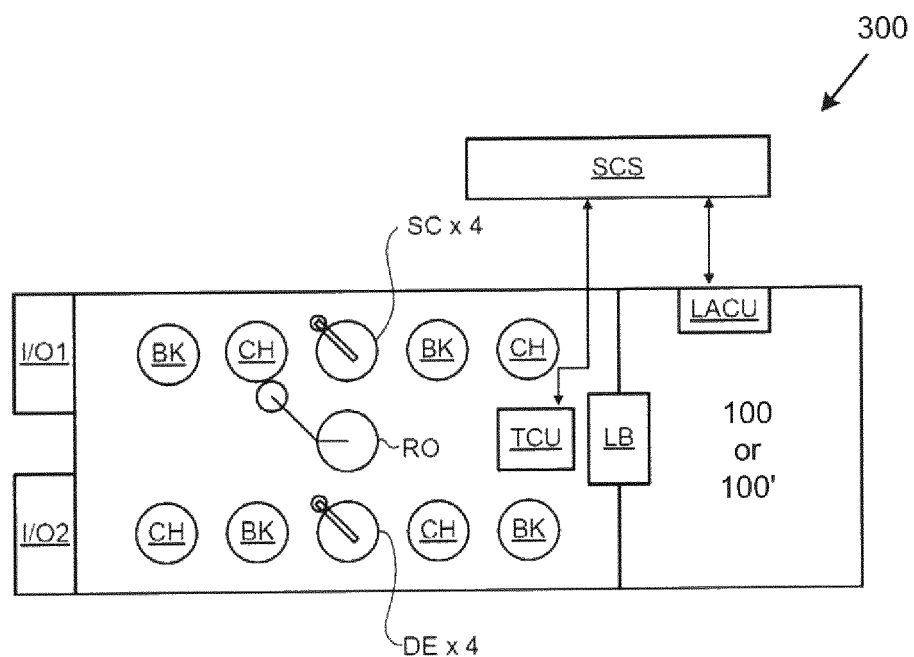
FIG. 3 is a schematic illustration of a lithographic cell, according to an embodiment of the disclosure.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Exemplary Systems for Particle Suppression

Figure 4:
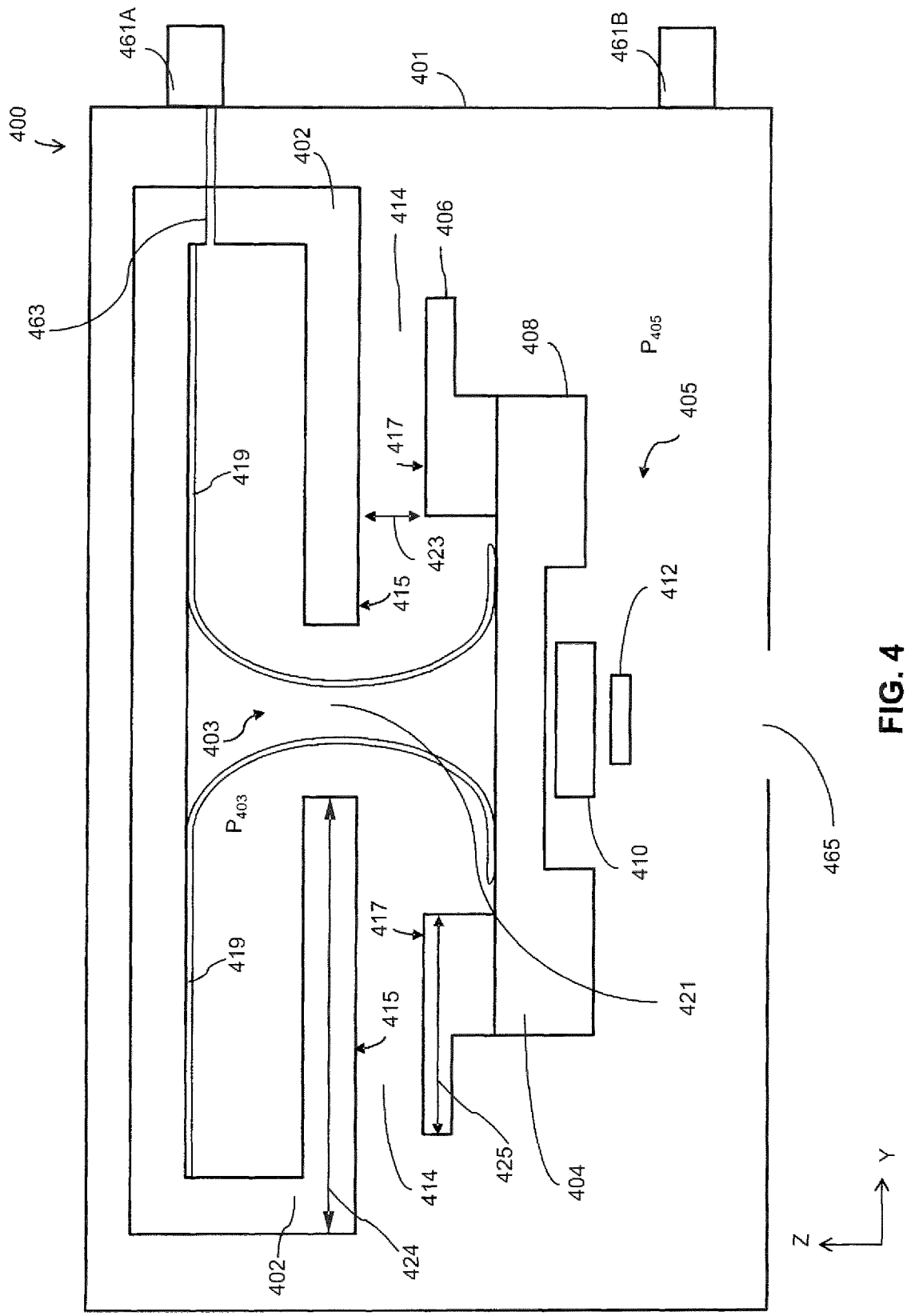
FIG. 4 schematically depicts, in cross-section, a reticle stage, according to an embodiment of the disclosure.

The embodiments of this disclosure can be used with one or more apparatuses of FIGS. 1A, 1B, 2, and/or 3. For example, the embodiments of this disclosure can be applied to object stages (e.g., support structures, such as reticle stage or mask table MT or substrate table WT), that are configured to support an object, such as substrate W and patterning device MA. FIG. 4 schematically depicts, in cross-section, one embodiment of a reticle stage 400. Although some of the embodiments of this disclosure are discussed with respect to a reticle stage, the embodiments of this disclosure can be applied to other suitable components (e.g., substrate table WT, wafer stage, wafer handler, reticle handler, or other components sensitive to particle contamination) of a lithography apparatus (e.g., lithography apparatuses 100 and 100' as described in this disclosure), or other particle sensitive apparatuses such as metrology systems, tubes, gas flow ducts, or boxes of gas ducts/pipes. The embodiments of this disclosure can also be applied to any particle sensitive apparatus to reduce the number of undesired contaminant particles.

Reticle stage 400 is configured to support and move a patterning device 412. Reticle stage 400 can have one or more particle traps and/or one or more particle barriers configured to reduce the possibility that contamination particles reach patterning device 412 and/or regions near patterning device 412. For example, as depicted in FIG. 4, reticle stage 400 can include a first structure 402 and a second structure 404 that are movable relative to each other. In some embodiments, first structure 402 is stationary, and second structure 404 is movable. In some embodiments, first structure 402 is movable, and second structure 404 is stationary. And in some embodiments, both first and second structures 402 and 404 are movable or stationary as needed.

First and second structures 402 and 404 can be positioned within a housing 401. In some embodiments, first structure 402 is separate from housing 401 as shown in FIG. 4. In some embodiments (not shown), first structure 402 is part of housing 401. Housing 401 can define a volume held at a vacuum pressure—a pressure below the atmospheric pressure. In some embodiments, housing 401 includes an opening 465 configured to allow radiation to pass from illumination system IL to patterning device 412 and back to projection system PS. Within housing 401, one or more of first structure 402 and second structure 404 can at least partially define at least a first chamber 403 and a second chamber 405. In some embodiments, housing 401 can include more than two vacuum chambers. In some embodiments, a gap 414 extends between first chamber 403 and second chamber 405. In some embodiments, gap 414 is created by the coupling between first structure 402 and second structure 404 that allows relative movement therebetween. In some embodiments, the boundary between first chamber 403 and second chamber 405 is defined by gap 414.

According to some embodiments, first chamber 403 and second chamber 405 can be held at a vacuum pressure—a pressure below the atmospheric pressure. For example, the vacuum pressure can range from about 0.1 Pa to about 8.5 Pa. In some examples, the vacuum pressure can range from about 0.5 Pa to about 8.5 Pa. For example, the vacuum pressure can range from about 1.5 Pa to about 8.5 Pa. In some examples, the vacuum pressure can range from about 2 Pa to about 5 Pa. For example, the vacuum pressure can range from about 2 Pa to about 3 Pa. In some embodiments, the pressure P405 in second chamber 405 can be similar to or different from the pressure P403 in first chamber 403. For example, the pressure P405 in second chamber 405 can be more than the pressure P403 in first chamber 403. For example, the pressure P403 in first chamber 403 can be about 0.25 Pa to about 1 Pa, and the pressure P405 in second chamber 405 can be about 2 Pa to about 3 Pa. When the pressure P405 in second chamber 405 is more than the P403 pressure in first chamber 403, gas may naturally flow from second chamber 405 to first chamber 403 through, for example, gap 414—e.g., a purge gas flow. Reticle stage 400 can include various particle trap and/or particle barrier configurations discussed below to reduce the possibility that contamination particles can reach patterning device 412 and/or regions near patterning device 412 in second chamber 405.

In some embodiments, patterning device 412 is mounted to second structure 404 such that second structure 404 can move patterning device 412 within second chamber 405. For example, second structure 404 can be (entirely or part of) a chuck configured to support and move patterning device 412. According to some embodiments, second structure 404 can move patterning device 412 in a scan direction (e.g., a direction parallel to the Y-axis in FIG. 4) and in a direction transverse to the scan direction (e.g., a direction parallel to the X-axis in FIG. 4). In some embodiments, second structure 404 includes a first part 408 and a second part 410 moveable relative to first part 408. And patterning device 412 can be mounted to second part 410 in some embodiments.

According to some embodiments, second part 410 can be a short stroke module (fine positioning) of reticle stage 400 that supports patterning device 412. Second part 410 can be coupled to first part 408 such that second part 410 can move relative to first part 408 but also driven by first part 408. In a non-limiting example, second part 410 is coupled to the first part 408 by one or more actuators (not shown), such as motors, configured to move second part 410. In some embodiments, second part 410 can move in the scan direction (e.g., the direction parallel to the Y-axis in FIG. 4) and in the direction transverse to the scan direction (e.g., the direction parallel to the X-axis in FIG. 4). According to some embodiments, first part 408 can be a long stroke module (coarse positioning) of reticle stage 400 configured to move relative to first structure 402. In some embodiments, first part 408 can move in the scan direction (e.g., the direction parallel to the Y-axis in FIG. 4), in the direction transverse to the scan direction (e.g., the direction parallel to the X-axis in FIG. 4), and rotate about an axis perpendicular to both the scan direction and the transverse direction (e.g., an axis parallel to the Z-axis in FIG. 4). According to some examples, second part 410 can move with respect to first part 408 over a small range of movements relative to the range of movement of first part 408 relative to first structure 402. Short stroke and long stroke modules are merely examples of parts 410 and 408, respectively, and other structures can be used as parts 408 and 410. Further, the movement of parts 408 and 410 discussed above are exemplary movements, and the embodiments of this disclosure can include other directions and movement ranges.

As a non-limiting example, second structure 404, including first part 408 and second part 410, can be made of metals. An example of metal that can be used is Aluminum. But other metals can be used too. As another non-limiting example, second structure 404 can be made of Aluminum with a Nickel (Ni) coating, and first structure 402 can be made of metals, such as, but not limited to, stainless steel. First part 408 and second part 410 can include same or different materials. In some embodiments, first structure 402 and second structure 404 are each made of metal, for example, stainless steel, nickel coated aluminum, or any other suitable metal. In some embodiments, first structure 402 and second structure 404 are each made of plastic or any other suitable material.

Gap 414 between first structure 402 and second structure 404 can be formed by opposing, spaced apart surfaces 415 and 417 of first structure 402 and second structure 404. In some embodiments, first chamber 403, first structure 402, and second structure 404 may contain parts that may be contaminant particle sources, for example, cable and hose carriers 419 that house electrical wires, fluid hoses, and/or gas hoses that electrically and/or fluidly couple second structure 404 to first structure 402 or other components of the lithographic apparatus. Cable and hoses carriers 419 (sometimes referred to as cable slabs) can have any suitable configuration for housing and/or supporting cables and/or hoses. The cable and hose carriers can be unsegment without mechanical hinges or segmented with mechanical hinges, in some embodiments. For example, as second structure 404 moves to position patterning device 412 so too does cable and hose carrier 419. In some examples, cable and hose carrier 419 can be designed as a rolling loop. Movement of cable and hose carrier 419 may generate contamination particles that may travel from first chamber 403 to second chamber 405 via gap 414. Accordingly, in some embodiments, gap 414 is configured to function as a seal to reduce or block the amount of particles passing through gap 414 into second chamber 405. Various particle trap and particle barrier configurations are discussed below to further reduce the amount of particles that could potentially pass through gap 414 and eventually come in contact with patterning device 412 in second chamber 405. In some embodiments, gap 414 is created by the coupling between first structure 402 and a seal part 406 of second structure 404.

Again, first chamber 403 is defined, at least in part, by stationary first structure 402 and movable second structure 404. As shown in FIG. 4, stationary first structure 402 can include an opening 421 through which one or more cable and hose carriers 419 pass. According to some examples, a pump 461A configured to create negative pressure difference, such as a suction pump, a vacuum pump, etc., can be operationally coupled to first chamber 403 (for example, at an upper portion of first structure 402) to create the vacuum pressure in first chamber 403 and second chamber 405. The flow created by the pump may also pull particles from first chamber 403. In some examples, pump 461A can be located outside housing 401 and is operationally coupled to first chamber 403 via a conduit 463. Additionally or alternatively, pump 461A can be inside housing 401 and is operationally coupled to first chamber 403. According to some examples, a pump 461B configured to create negative pressure difference, such as a suction pump, a vacuum pump, etc., can be operationally coupled to second chamber 405 to create the vacuum pressure in, for example, second chamber 405.

Although pump 461A is illustrated on a side of housing 401 away from opening 421, pump 461A can be positioned at other locations, for example, near opening 421 and/or near the source of particle contamination, in some embodiments. In some embodiments in which pump 461A is positioned near opening 421 and/or near the source of particle contamination, the velocity of gas flow away from chamber 405 is maximized.

In some examples, gap 414 can have a height 423 (the distance between (a) surface 415 of first structure 402 and (b) surface 417 of second structure 404 facing stationary first structure 402) of about 0.1 mm to about 5 mm. For example, gap 414 can have a height 423 of about 1.5 mm to 2.5 mm. However, it is noted these are exemplary dimensions and the embodiments of this disclosure are not limited to these examples.

In some embodiment, gap 414 can have a length 425 of which surface 415 of first structure 402 is adjacent surface 417 of second structure 404. For example, length 425 of gap 414 can be about 50-350 mm. For example, length 425 of gap 414 can be about 70-320 mm. For example, length 425 of gap 414 can be about 75-315 mm. However, it is noted these are exemplary dimensions and the embodiments of this disclosure are not limited to these examples. Contamination particles moving through gap 414 bounce between surfaces 415 and 417. This bouncing causes the particles to lose energy and velocity, which allows the particles to either stick to surfaces 415 and 417, or slow to a magnitude that allows the gas flowing from through gap 414 towards chamber 403 (e.g., due to pressure differences in chambers 403 and 405) to push the particles back towards chamber 403. Accordingly, gap 414 functions as a seal that eliminates or reduces the amount of contamination particles from first chamber 403 that reach patterning device 402 and/or regions near patterning device 402 in second chamber 405.

In some embodiments, length 425 (which can correspond to the length of surface 417) plus the range of motion of second structure 404 in the scan direction (e.g., along the Y-axis in FIG. 4) is less than a length 424 of surface 415. As such, the seal formed by gap 414 is maintained during normal motion of second structure 404 in the scan direction.

In some examples, surface 417 of second structure 404 can project inward (e.g., toward first chamber 403) or outward (e.g., away from first chamber 403) from the perimeter of second structure 404.

The seal can extend entirely or partially around the periphery of first chamber 403 in some embodiments. The seal can have similar or different lengths along the scan direction (e.g., the Y axis) and along the direction transverse to the scan direction (e.g., the X-axis). In a non-limiting example, the seal can be longer along the scan direction (e.g., the Y axis) than along the direction transverse to the scan direction (e.g., the X-axis).

Exemplary Barriers and Traps for Particle Suppression

Figure 5:
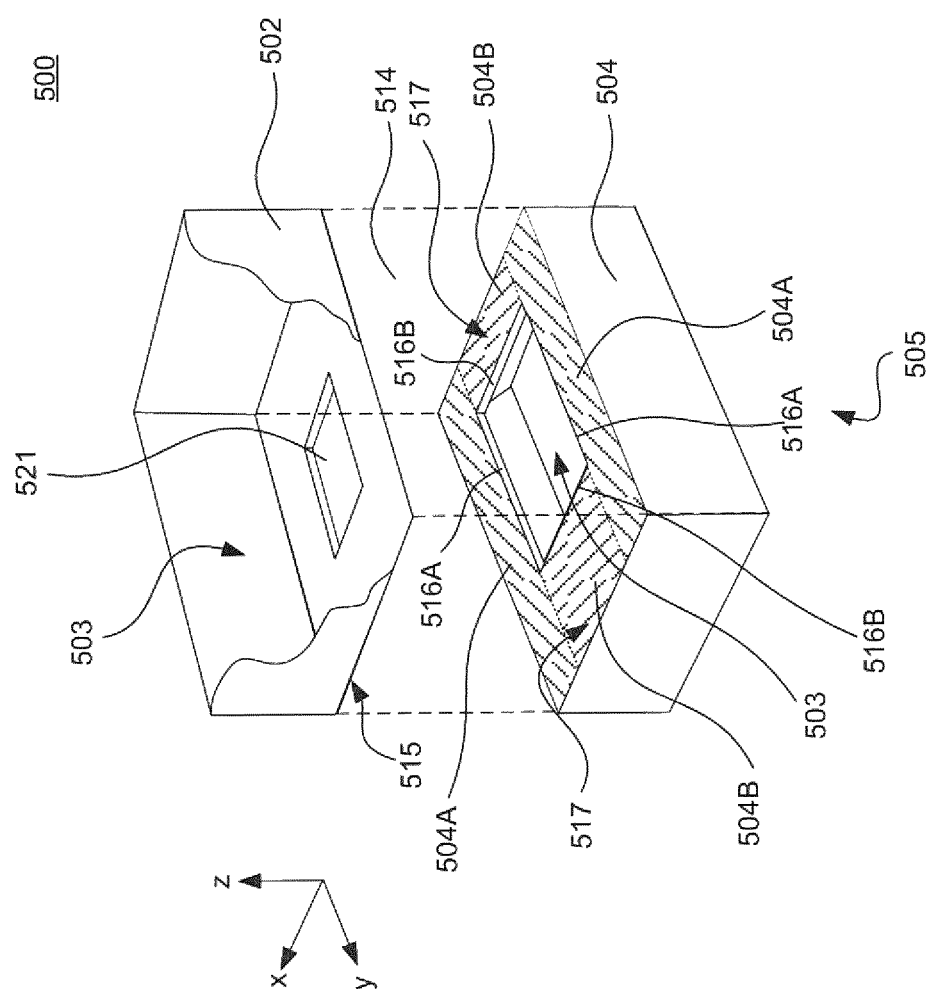
FIG. 5 schematically depicts a perspective view of an apparatus having particle suppression barriers or traps, according to an embodiment of the disclosure.

FIG. 5 illustrates a schematic perspective and exploded view of an apparatus 500 that can have one or more particle suppressing barriers in accordance with the various embodiments of this disclosure. Apparatus 500 can be a reticle stage such as reticle stage 400 of FIG. 4, in some embodiments.

Accordingly, features of apparatus 500 that are similar to the features of reticle stage 400 are labeled with a similar reference number to those in FIG. 4, but prefixed with a 5 instead of a 4. However, the embodiments of FIG. 5 can be applied to other suitable components of a lithography apparatus (e.g., lithography apparatuses 100 and 100' as described in this disclosure), other particle sensitive apparatus such as metrology systems, tubes, gas flow ducts, or boxes of gas ducts/pipes, and/or any particle sensitive apparatus to reduce the number of undesired contaminant particles.

As shown in FIG. 5, apparatus 500 can include a stationary first structure 502 and a movable second structure 504. Again, the terms stationary and movable are interchangeable and are only used to describe the relative movements between the structures. Structure 502 could be movable, and structure 504 could be stationary in some embodiments. Or in some embodiments, both structures 502 and 504 are movable or stationary as needed.

A surface 517 of movable structure 504 and opposing surface 515 can each include zones 504A and zones 504B. As shown in FIG. 5, zones 504A extend in the scan direction (e.g., the Y-axis) along edges 516A of an opening 521 collectively defined by first and second structures 502 and 504. And as shown in FIG. 5, zones 504B extend in the direction transverse to the scan direction (e.g., the X-axis) along edges 516B of opening 521. A gap 514 can be created by the coupling between stationary first structure 502 and movable second structure 504 that allows relative movement therebetween.

As discussed in more detail below, one or more particle suppressing barriers (for example, foil or baffle barriers) can be disposed in gap 514 in one or more of zones 504A and 504B. The particle suppressing barriers can be configured to reduce the amount of particles that could potentially leave first chamber 503 and pass through gap 514 toward second chamber 505. In some embodiments, these particle suppressing barriers obstruct the line of sight along at least one direction in gap 514 (e.g., along the scan direction (the Y-axis) or along the direction transverse to the scan direction (the X-axis)).

Exemplary Foil Barriers

In some embodiments, the apparatus includes a foil barrier disposed in the gap formed between the first and second structures that restrains contaminant particles from passing through the gap. FIGS. 6A-6D schematically depict, in cross-sections, various configurations of an apparatus 600 having foil barriers for particle suppression, in accordance with various embodiments of the disclosure. Apparatus 600 can be a reticle stage such as reticle stages 400 and 500 of FIGS. 4 and 5, in some embodiments. Accordingly, features of apparatus 600 that are similar to the features of reticle stages 400 and 500 are labeled with similar reference numbers to those in FIGS. 4 and 5, but prefixed with a 6 instead of a 4 or 5. However, the embodiments of FIGS. 6A-6D can be applied to other suitable components of a lithography apparatus (e.g., lithography apparatuses 100 and 100' as described in this disclosure), other particle sensitive apparatus such as metrology systems, tubes, gas flow ducts, or boxes of gas ducts/pipes, and/or any particle sensitive apparatus to reduce the number of undesired contaminant particles.

Figure 6A:
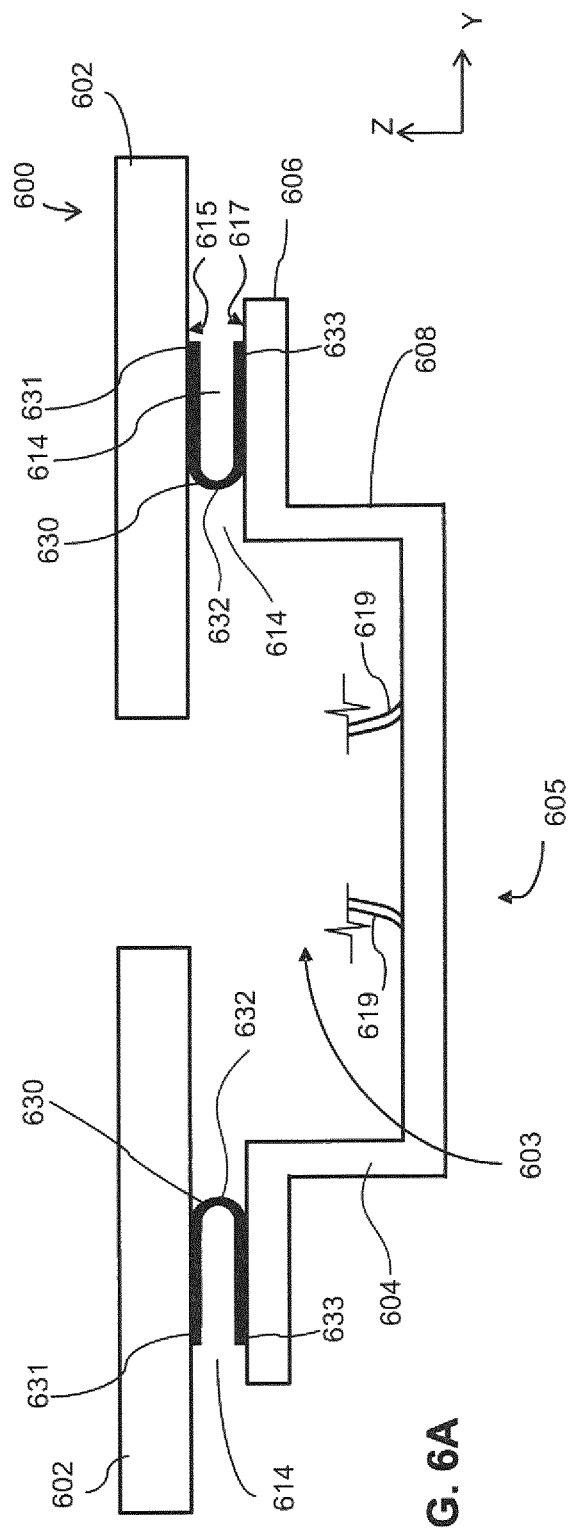
FIGS. 6A-6D schematically depict, in cross-sections, various configurations of particle barriers for particle suppression, according to various embodiments of the disclosure.

As illustrated in FIG. 6A, which is a side cross-sectional view, apparatus 600 can include a stationary first structure 602 and a movable second structure 604. Again, the terms stationary and movable are interchangeable and only used to describe the relative movements between different parts of system. It is possible that first structure 602 is movable, and second structure 604 is stationary, or both structures are movable or stationary as needed. First chamber 603 is defined, at least in part, by stationary first structure 602 and movable second structure 604. Cable and hose carriers 619 that electrically and/or fluidly couple second structure 604 to first structure 602 or other components of the lithographic apparatus are located inside first chamber 603.

The embodiments of FIGS. 6A-6D are configured to reduce or eliminate the amount of particles that could potentially leave first chamber 603 and pass through gap 614. For example, according to some embodiments, apparatus 600 may include one or more barriers in gap 614 between first and second structures 602 and 604. The barrier can be configured to stop particles or reduce the amount of particles that could potentially leave first chamber 603 and pass through gap 614. In some embodiments as shown in FIGS. 6A-6D, the one or more barriers can each be a foil 630 located in gap 614 extending between stationary first structure 602 and movable second structure 604. In some embodiments, foils 630 can stop any contaminant particle that might travel through gap 614 from first chamber 603 toward second chamber 605 in a direction along the scan direction (e.g., the Y-axis). In some examples, a first end 631 of foil 630 is fixedly coupled to surface 615 of stationary first structure 602, and a second end 633 of foil 630 is fixedly coupled to surface 617 of movable second structure 604. In some examples, ends 631 and 633 of foil 630 can be coupled to first and second structures 602 and 604 using any bonding technique (such as, but not limited to, an adhesive component, laser or ultrasonic welding, chemical boding, fasteners (such as bolts, screws, etc.), clamping, or a combination thereof).

And in some examples, an intermediate portion 632 of foil 630 is positioned closer to first chamber 603 than the first and second ends 631 and 633 of foil 630 to form a curved rolling foil arrangement. Such a rolling foil arrangement of foil 630 can stop particles that could potentially leave first chamber 603 and pass through gap 614, while not interfering with movement between first structures 602 and second structure 604, for example, movement along the Y-axis in FIGS. 6A-6D.

Figure 6B:
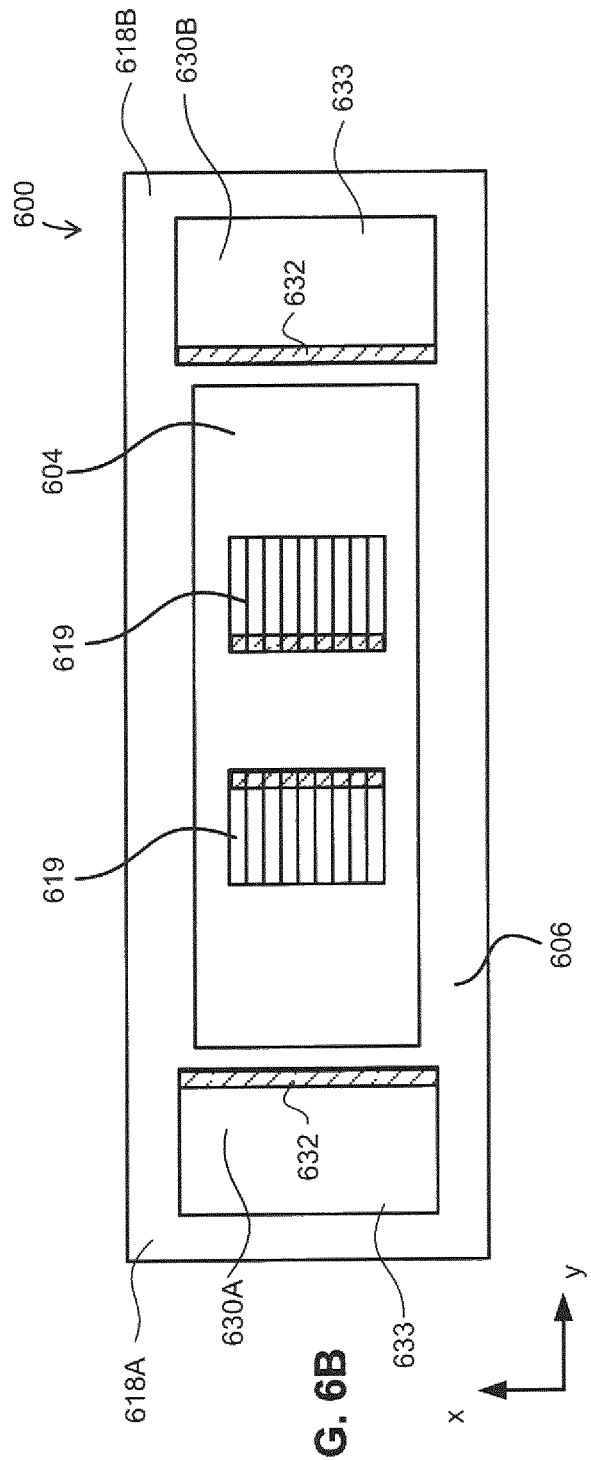

FIG. 6B illustrates, in a cross section, a top view of apparatus 600, in accordance with various embodiments of the disclosure. As shown in FIG. 6B, apparatus 600 can include a single first foil 630A on a first side 618A of first structure 602 (not shown in FIG. 6B) and second structure 604, and a single second foil 630B on a second side 618B of first structure 602 (not shown in FIG. 6B) and second structure 604. In some examples as shown in FIG. 6B, foils 630A and 630B extend along substantially the entire dimension of the seal part 606 in the direction transverse to the scan direction (e.g., the direction along the X-axis). For example, foils 630A and 630B are disposed in gap 614 to cover areas that correspond to zones 504B in FIG. 5. As such, the line of sight in gap 614 (not shown in FIG. 6B) is obstructed along the scan direction (e.g., the Y-axis).

Figure 6C:
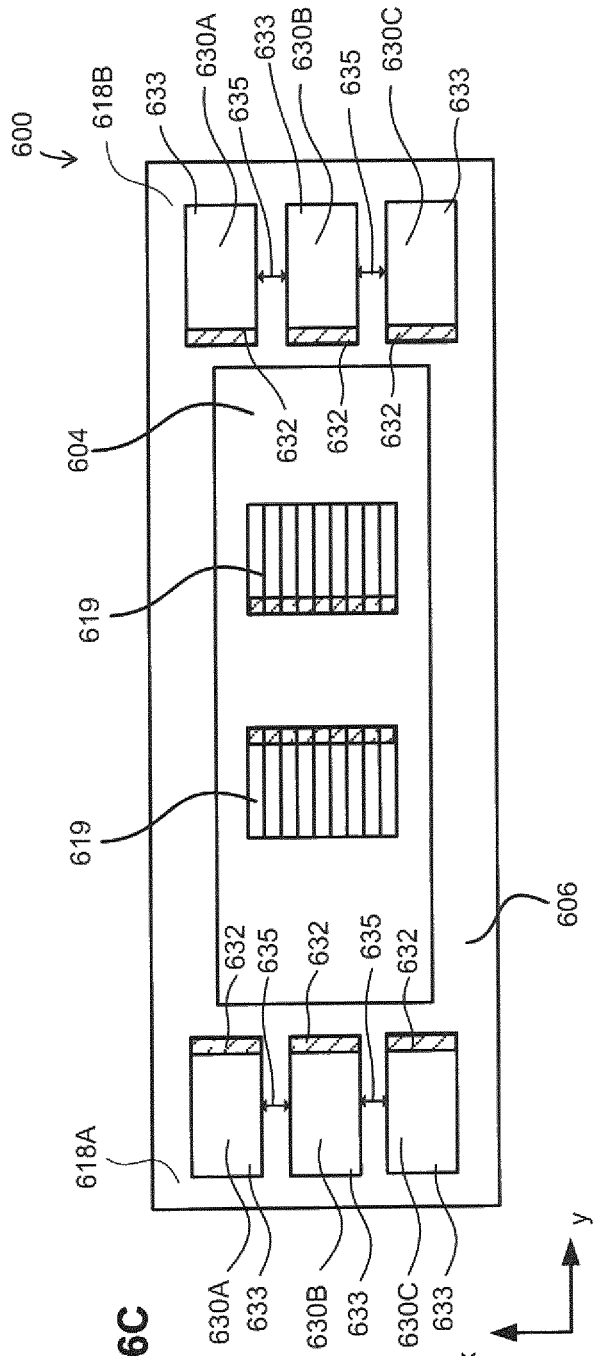

FIG. 6C illustrates a cross-sectional top view of apparatus 600, in accordance with various embodiments of the disclosure. As shown in FIG. 6C, apparatus 600 can include more than one foil 630 on each side of first structure 602 (not shown in FIG. 6C) and second structure 604. For example, apparatus 600 can include three foils 630A, 630B, and 630C coupled to seal part 606 of movable second structure 604 at a first side 618A of first structure 602 (not shown in FIG. 6C) and second structure 604, and apparatus 600 can include three foils 630A, 630B, and 630C coupled to seal part 606 of movable second structure 604 at a second side 618B of first structure 602 (not shown in FIG. 6C) and second structure 604.

As shown in FIG. 6C, foils 630A, 630B, and 630C on each side 618A and 618B are aligned along the direction transverse to the scan direction (e.g., the X-axis.) In some embodiments, foils 630A, 630B, and 630C are separated from the adjacent foil by a gap 635. Separating foils 630A, 630B, and 630C with gaps 635 allows second structure 604 to rotate relative to first structure 602 (not shown in FIG. 6C) about an axis perpendicular to the plane defined by surface 617 (e.g., rotation about the Z-axis.) Separating foils 630A, 630B, and 630C with gaps 635 allows movement between stationary first structure 602 and movable second structure 604 along, for example, the direction transverse to the scan direction (e.g., the X-axis). While allowing rotation about the Z-axis and translation along the X-axis, for example, foils 630A, 630B, and 630C can also stop particles or reduce the amount of particles that could potentially leave first chamber 603 and pass through gap 614. Additionally, foils 630A, 630B, and 630C can also not interfere with movement between stationary first structure 602 and movable second structure 604 along, for example, the scan direction (e.g., the Y-axis), due to their rolling configuration. In some examples as shown in FIG. 6C, foils 630A, 630B, and 630C are disposed in gap 614 to substantially cover areas that correspond to zones 504B in FIG. 5. As such, except for the areas aligned with gaps 635, the line of sight in gap 614 (not shown in FIG. 6C) is obstructed along the scan direction (e.g., the Y-axis).

Figure 6D:
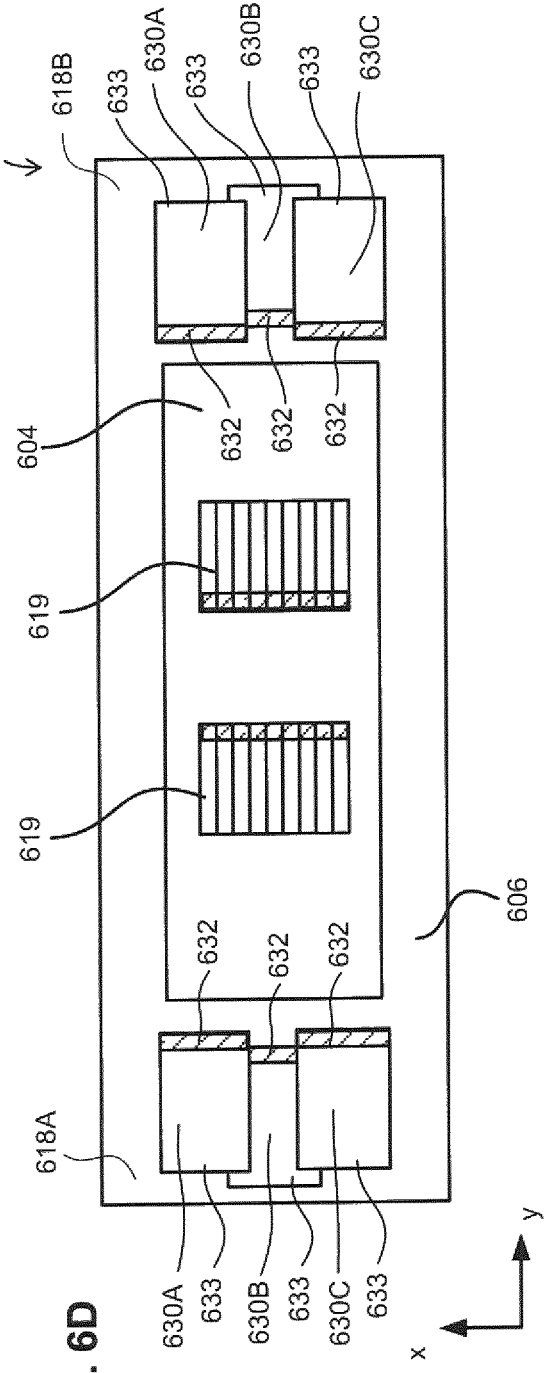

FIG. 6D illustrates a cross-sectional top view of apparatus 600, in accordance with various embodiments of the disclosure. As shown in FIG. 6D, apparatus 600 can include more than one foil 630 on each side of first structure 602 (not shown in FIG. 6D) and second structure 604. For example, apparatus 600 can include three foils 630A, 630B, and 630C coupled to seal part 606 of movable second structure 604 at a first side 618A of first structure 602 (not shown in FIG. 6D) and second structure 604, and apparatus 600 can include three foils 630A, 630B, and 630C coupled to seal part 606 of movable second structure 604 at a second sided 618B of first structure 602 (not shown in FIG. 6D) and second structure 604.

As shown in FIG. 6D, foils 630A, 630B, and 630C on each side 618A and 618B can be extended along the direction transverse to the scan direction (e.g., the X-axis.) In this example, foils 630A-630C are disposed such that foil 630B partially overlaps with foils 630A and 630C. Positioning foils 630A, 630B, and 630C as shown in FIG. 6D to partially overlap allows second structure 604 to rotate relative to first structure 602 (not shown in FIG. 6D) about an axis perpendicular to the plane defined by surface 617 (e.g., rotation about the Z-axis.) Positioning foils 630A, 630B, and 630C as shown in FIG. 6D to partially overlap allows movement between stationary first structure 602 and movable second structure 604 along, for example, the direction transverse to the scan direction (e.g., the X-axis). While allowing rotation about the Z-axis and translation along the X-axis, for example, foils 630A, 630B, and 630C can also stop particles or reduce the amount of particles that could potentially leave first chamber 603 and pass through gap 614. Additionally, foils 630A, 630B, and 630C can also not interfere with movement between stationary first structure 602 and movable second structure 604 along, for example, the scan direction (e.g., the Y-axis), due to their rolling configuration. In some examples as shown in FIG. 6D, foils 630A, 630B, and 630C are disposed in gap 614 to substantially cover areas that correspond to zones 504B in FIG. 5. As such, the line of sight in gap 614 (not shown in FIG. 6D) is obstructed along the scan direction (e.g., the Y-axis).

Although FIGS. 6C and 6D illustrate three foils 630A-630C on each side of first structure 602 (not shown in FIGS. 6C and 6D) and second structure 604, the embodiments of this disclosure can include any number of foils.

According to some examples, foil(s) 630 can be made of metal(s). As a non-limiting example, foil(s) 630 can be Aluminum and, in some embodiments, a Nickel (Ni) coated Aluminum. Other examples of metal that can be used are Tin, steel, stainless steel, or any other suitable metal. As another non-limiting example, foil(s) 630 can be a metal foil coated with Polytetrafluoroethylene (PTFE).

According to some examples, foil(s) 630 can be made of polymer(s). The polymer can include polyethylene (PE), Polyether ether ketone (PEEK), Kapton, PTFE, or any other suitable polymer.

According to some examples, the length of foil(s) 630 (e.g., the distance between ends 631 and 633 when laid flat along the Y-axis (not in a rolling configuration)), the width of foil(s) 630 along the direction transverse to the scan direction (e.g., the X-axis), the thickness of width of foil 630, and the radius of the curve of intermediate portion 632 in the rolling configuration can vary based on different parameters and design requirements. In one example, a bending radius of the curve of intermediate portion 632 in the rolling configuration can be about 0.5 mm to about 1.5 mm. For example, a bending radius of curve of intermediate portion 632 of foil 630 can be about 0.75 mm to about 1.25 mm. For example, a bending radius of curve of intermediate portion 632 of foil 630 can be about 1 mm. In one example, the thickness of foil 630 can be about 50 µm to about 200 µm. For example, the thickness of foil 630 can be about 75 µm to about 150 µm. In some examples, the length of foil 630 along the scan direction (e.g., the Y-axis) (the distance between ends 631 and 633 when laid flat along the Y-axis (not in a rolling configuration)) can be about twice length 425 (as shown in FIG. 4) of gap 514. For example, the length of foil 630 can be about 150 mm to about 650 mm. However, it is noted these are exemplary dimensions and the embodiments of this disclosure are not limited to these examples.

Exemplary Baffle Barriers

Figure 7:
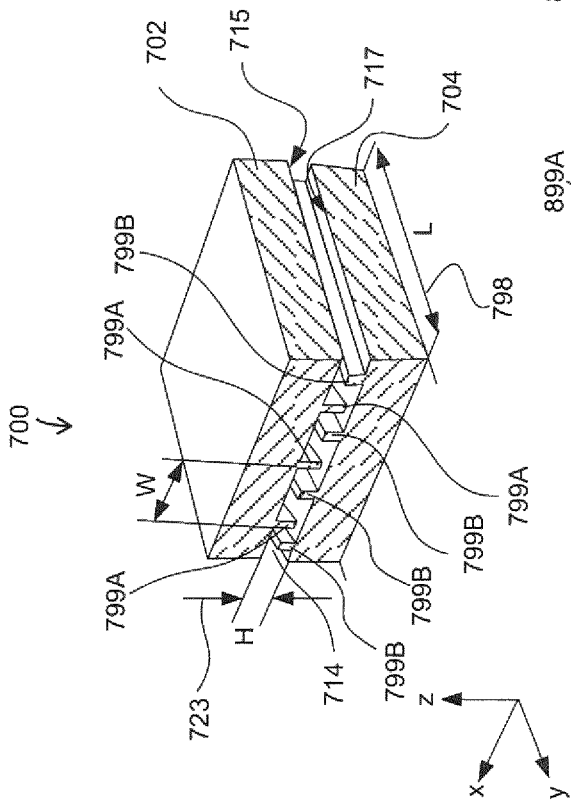
FIG. 7 schematically depicts a perspective, cross-sectional view of an apparatus having a baffle particle barrier, according to an embodiment of the disclosure.

FIG. 7 illustrates a partial, perspective view of an apparatus 700 having a particle suppressing barrier made of interdigitated projecting baffles, in accordance with various embodiments of the disclosure. Apparatus 700 can be a reticle stage such as reticle stages 400, 500, and 600 of FIGS. 4, 5, and 6, in some embodiments. Accordingly, features of the embodiment of FIG. 7 that are similar to the features of reticle stages 400, 500, and 600 are labeled with similar reference numbers to those in FIGS. 4, 5, and 6, but prefixed with a 7 instead of a 4, 5, or 6. However, the embodiments of FIG. 7 can be applied to other suitable components of a lithography apparatus (e.g., lithography apparatuses 100 and 100' as described in this disclosure), other particle sensitive apparatus such as metrology systems, tubes, gas flow ducts, or boxes of gas ducts/pipes, and/or any particle sensitive apparatus to reduce the number of undesired contaminant particles.

As shown in FIG. 7, apparatus 700 can include a stationary first structure 702 and a moveable second structure 704. Again, the terms stationary and movable are interchangeable and only used to describe the relative movements between these structures. First structure 702 can be movable, and second structure 704 can be stationary. Or both structures can be movable or stationary as needed.

As illustrated in FIG. 7, apparatus 700 includes a particle suppressing barrier including a plurality (i.e., two or more) of interdigitated projecting baffles, which can reduce the amount of particles that can pass through a gap 714 between first structure 702 and second structure 704 and eventually come in contact with the patterning device. According to some examples, one or more projecting baffles 799A extend from surface 715 of stationary first structure 702. Similarly, one or more projecting baffles 799B extend from surface 717 of moveable second structure 704. Baffles 799A are interdigitated with baffles 799B.

In some embodiments, baffles 799A and 799B are disposed in gap 714 in areas that correspond to zones 504A discussed above with respect to FIG. 5. In some examples, substantially the entire areas corresponding to zones 504A include interdigitated projecting baffles 799A and 799B. Additionally or alternatively, in some examples, baffles 799A and 799B are disposed in gap 714 in areas that correspond to zones 504B discussed above with respect to FIG. 5. In some examples, substantially the entire areas corresponding to zones 504B include interdigitated baffles 799A and 799B.

According to some examples, interdigitated baffles 799A and 799B extend from respective surfaces 715 and 717 in a direction (e.g., the Z-axis) perpendicular to the plane defined by the scan direction (e.g., the Y-axis) and the direction transverse to the scan direction (e.g., the X-axis). And as shown in FIG. 7, a major dimension 798 of each interdigitated baffle 799A and 799B extends along the scan direction (e.g., the Y-axis) and are parallel to adjacent baffles 799A and 799B.

In some embodiments, interdigitated projecting baffles 799A and 799B are designed to not interfere with the relative movement between stationary first structure 702 and movable second structure 704 along the scan direction (e.g., the Y-axis) during operation of apparatus 700. For example, due to the parallel configuration of adjacent baffles 799A and 799B along the scan direction, as second structure 704 moves along the scan direction, baffles 799A and baffles 799B do not contact each other. In some embodiments, interdigitated projecting baffles 799A and 799B are designed to not interfere with the relative movement between stationary first structure 702 and movable second structure 704 along a direction transverse to the scan direction (e.g., the X-axis) during operation of apparatus 700. For example, as second structure 704 moves along the direction transverse to the scan direction, baffles 799A and baffles 799B do not contact each other. For example, during operation, the relative movement along the direction transverse to the scan direction (e.g., the X-axis) is typical smaller than a distance between one baffle 799A and an adjacent baffle 799B. However, if the movement of the stationary structure and the movable structure with respect to each other along the direction transverse to the scan direction (e.g., the X-axis) is more than the distance between the adjacent baffles, the adjacent baffles will contact each other and can prevent further movement.

According to some embodiments, interdigitated projecting baffles 799A and 799B act as a barrier to stop particles or reduce the amount of particles that can pass through gap 714 along at least the direction transverse to the scan direction (e.g., the X-axis). Due to the interdigitated configuration, projecting baffles 799A and 799B obstruct the line of sight in gap 714 along the direction transverse to the scan direction (e.g., the X-axis). Particles can travel from first chamber 403 to second chamber 405 along clear lines of sight through the gap 414/514. According to some examples, interdigitated projecting baffles 799A and 799B, running in parallel with the Y-axis, can fully obscure lines of sight passing over zones 504A and can obscure lines of sight that are not approximately parallel to the Y-axis for lines of sight passing over zones 504B. The suppression of lines of sight is approximately a factor L/W. Here, W is the distance between two adjacent projecting baffles projecting from the same surface (for example, between adjacent baffles 799A), and L is the length 798 of opposing surfaces 715 and 717 having baffles 799A and 799B along the scan direction (e.g., the Y-axis).

According to some embodiments, interdigitated projecting baffles 799A and 799B can also act as barrier to stop particles or reduce the amount of particles that can pass through gap 714 along the scan direction (e.g., the Y-axis). That is, although baffles 799A and 799B do not block the line of sight along the scan direction (e.g., the Y-axis) due to the parallel configuration of adjacent baffles 799A and 799B along the scan direction, interdigitated projecting baffles 799A and 799B can still help reduce or stop contamination particles that can pass through gap 714 along the scan direction (e.g., the Y-axis). As contamination particles pass through gap 714 along the scan direction, interdigitated projecting baffles 799A and 799B increase the number of times the particle bounces and, thus, increases the probability that the contamination particle stops in gap 714 before reaching the chamber having the patterning device.

In some embodiments, interdigitated projecting baffles 799A and 799B can have micro-baffles or bumps (not shown in FIG. 7) extending from interdigitated projecting baffles 799A and 799B to further suppress particles passing through gap 714. These micro-baffles can further randomize the bounces of contamination particles passing through gap 714, which can increase the number of bounces required before exiting gap 714 into the chamber containing the patterning device and, in turn, increase the probability that the particles will stop before exiting gap 714. In some embodiments, the height of the micro-baffles (i.e., the distance from the primary surface of projecting baffles 799A and 799B and the farthest point of the micro-baffles) is larger than the largest diameter of contamination particles anticipated to be in gap 714, but smaller than gap height H of gap 714. For example, the height of the micro-baffles can be about 50 μm.

Figure 9:
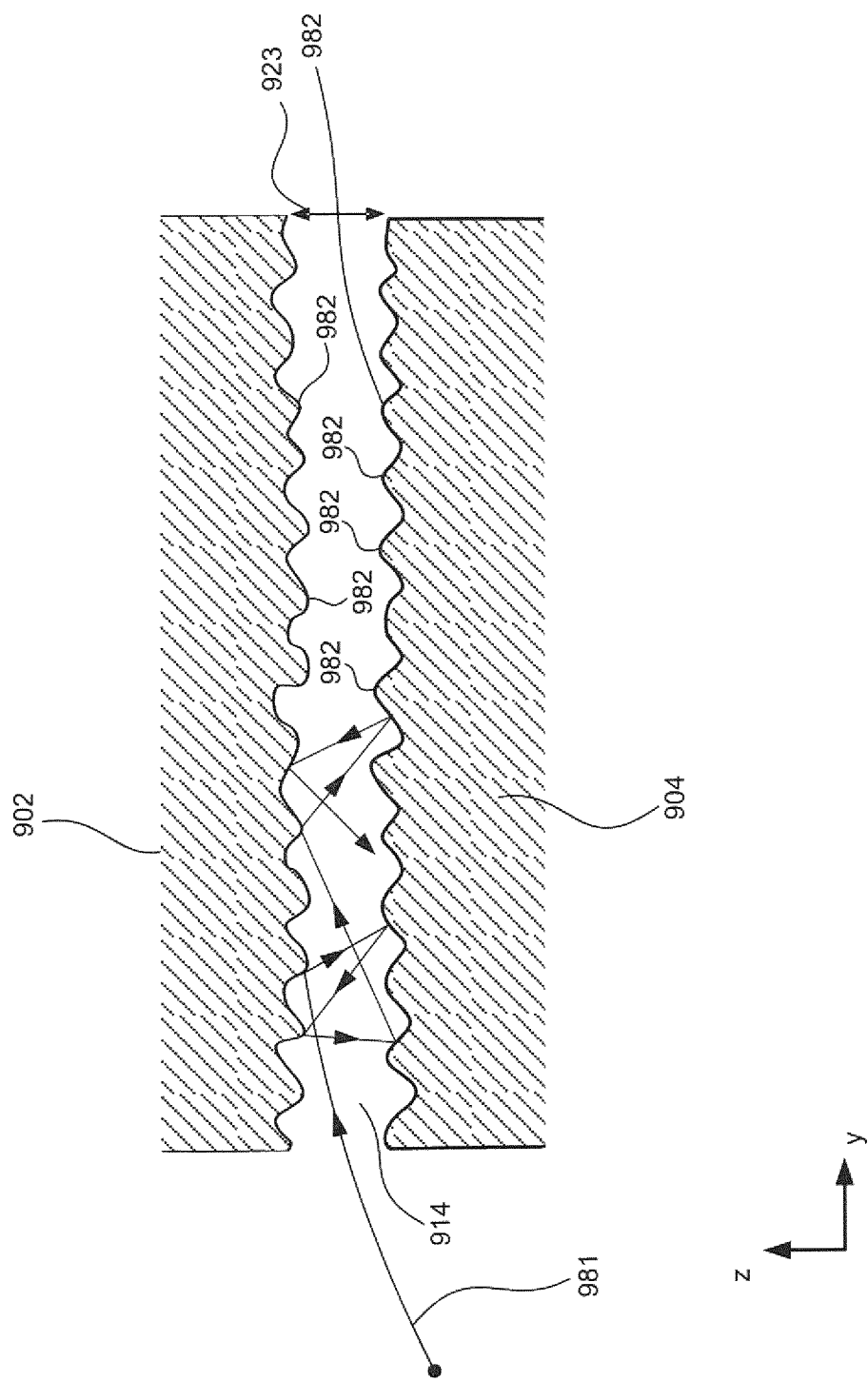
FIG. 9 schematically depicts, in cross-section, an exemplary particle barrier having micro-baffles, according to an embodiment of the disclosure.

FIG. 9 discloses exemplary micro-baffles that can be used on stationary first structure 902 or a moveable second structure 904. In some examples, micro-baffle structures 982 are disposed in gap 914 in areas that correspond to zones 504A discussed above with respect to FIG. 5. For example, part of or substantially the entire areas corresponding to zones 504A can include micro-baffle structures 982. Additionally or alternatively, micro-baffle structures 982 are disposed in gap 914 in areas that correspond to zones 504B discussed above with respect to FIG. 5. For example, part of or substantially the entire areas corresponding to zones 504B can include micro-baffle structures 982. For example, micro-baffle structures 982 can extend from first structure 902 or second structure 904 in a direction along, for example, the Z-axis. According to some examples, the size of each micro-baffle structure 982 can be larger than the biggest particle size that is anticipated to pass through a gap 914 between first structure 902 and second structure 904. According to some examples, the size of each of the projections of micro-baffle structures 982 is smaller than a gap height between the first and second structures. For example, the size of each micro-baffle structure 982 can be about 1 μm to about 60 μm. For example, the size of each micro-baffle structure 982 can be about 1 μm to about 10 μm.

For example, the size of each micro-baffle structures 982 can be about 10 µm to about 20 µm. For example, the size of each micro-baffle structure 982 can be about 20 µm to about 40 µm. For example, the size of each micro-baffle structures 982 can be about 40 µm to about 60 µm. However, other dimensions can be used. The number, size, shape, configuration, and distribution of micro-baffle structures 982 may vary based on different parameters and design requirements. Micro-baffle structures 982 can have different topographies. According to some examples, micro-baffle structures 982 are not periodic and are not parallel ridges. Additionally or alternatively, micro-baffle structures 982 can be dimples in the surfaces.

As discussed above, micro-baffles structures 982 can be used on first structure 902 or second structure 904. Additionally or alternatively, micro-baffles structures 982 can be disposed on baffles 799A or 799B in some embodiments. For example, each baffle 799A or 799B can include a plurality of micro-baffle structures 982 disposed on one or more surfaces of baffle 799A or 799B. For example, micro-baffle structures 982 can extend from each baffle 799A or 799B. Additionally or alternatively, micro-baffles structures 982 can be disposed on surfaces between baffles 799A or 799B. For example, and with reference to FIG. 7, micro-baffles structures 982 can be disposed on surface 717 of second structure 704 between baffles 799B. Additionally or alternatively, micro-baffles structures 982 can be disposed on surface 715 of first structure 702 between baffles 799A.

An exemplary functionality of the plurality of micro-baffle structures 982 is explained below, with reference to FIG. 9. Contaminant particles traveling through gap 914 will collide with micro-baffle structures 982. As shown, for example, in FIG. 9, micro-baffle structures 982 can change the direction of a trajectory 981 of a contaminant particle a plurality of times such that the particle collides with micro-baffle structures 982 a plurality of times. In some embodiments, micro-baffle structures 982 can include steep bumps. With each collision, the particle loses kinetic energy. And with low enough velocity or kinetic energy, the particle will stick to the surface of micro-baffle structures 982 due to van der Waals interaction. In an embodiment, micro-baffle structures 982 can be made of materials with a high Hamaker constant to increase the van der Waals force between contaminant particles and surfaces of micro-baffle structures 982, giving the contaminant particles a higher probability of sticking to the surfaces of micro-baffle structures 982. The collisions of particles with micro-baffle structures 982 significantly reduce the contaminant particle's kinetic energy such that the particles may become trapped on micro-baffle structures 982. Additionally or alternatively, micro-baffle structures 982 of FIG. 9 can minimize the correlation between a contaminant particle's incident velocity vector on micro-baffle structures 982 and its reflected velocity vector from structure 982, in some examples. In other words, micro-baffle structures 982 of FIG. 9 can randomize a contaminant particle's velocity vector after the contaminant particle is reflected from the micro-baffle structures 982, in some examples. Additionally or alternatively, micro-baffle structures 982 can include a grooved surface with parallel grooves.

Micro-baffle structures 982 of FIG. 9 can also be provided on other surfaces, such as surfaces of stationary first structure 402 and surfaces of movable second structure 404.

As shown in FIG. 7, the cross-sectional shape of projecting baffles 799A and 799B (along the plane perpendicular to the X-axis and the Z-axis) can be rectangular in some embodiments.

The number, size, shape, configuration, and distribution of interdigitated projecting baffles 799A and 799B may vary based on different parameters and design requirements. Additional non-limiting examples are provided in FIGS. 8 and 10A-10D. For example, projecting baffles 799A and 799B may also have any appropriate cross-section shape, for example, rectangular, triangular, rhomboid, or any other suitable cross-sectional shape. Examples of these configurations are shown in FIGS. 8 and 10B-10D.

Figure 8:
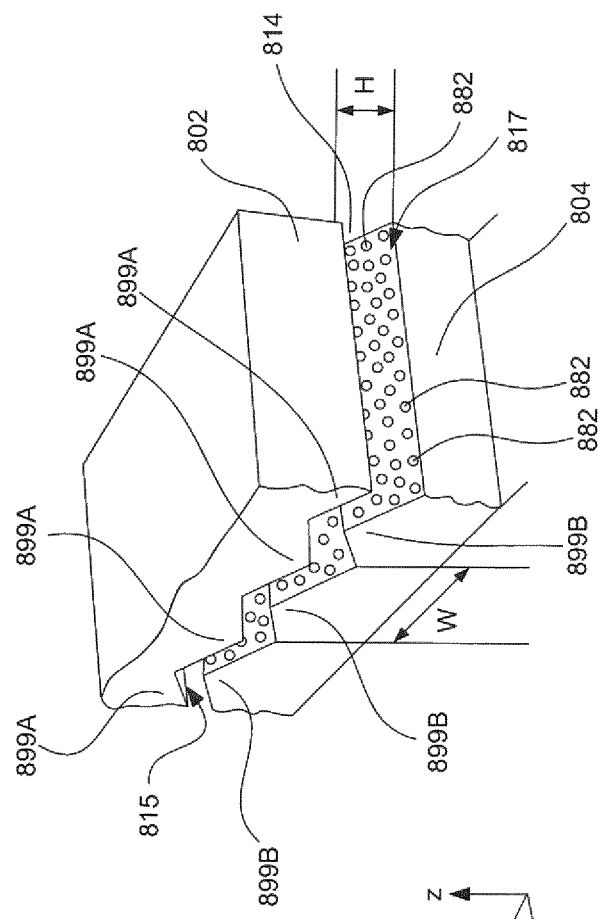
FIG. 8 schematically depicts a perspective, cross-sectional view of an apparatus having a baffle particle barrier, according to an embodiment of the disclosure.

For example, FIG. 8 illustrates a partial perspective view of an apparatus 800 having interdigitated projecting baffles with a triangular cross-section (along the plane perpendicular to the X-axis and the Z-axis) and a plurality of micro-baffle structures 882. Apparatus 800 can be a reticle stage such as reticle stages 400, 500, 600, and 700 of FIGS. 4, 5, 6, and 7, in some embodiments. Accordingly, features of the embodiment of FIG. 8 that are similar to the features of reticle stages 400, 500, 600, and 700 are labeled with similar reference numbers to those in FIGS. 4, 5, 6, and 7, but prefixed with a 8 instead of a 4, 5, 6, or 7, and are not further described.

FIGS. 10A-10D schematically depict, in cross section, exemplary interdigitated projecting baffles, in accordance with various embodiments of this disclosure. Features of the embodiment of FIG. 10 that are similar to the features of reticle stages 400, 500, 600, 700, and 800 are labeled with similar reference numbers to those in FIGS. 4, 5, 6, 7, and 8, but prefixed with a 10 instead of a 4, 5, 6, 7, or 8.

FIG. 10A illustrates projecting baffles 1099A provided on a surface 1015 of a stationary first structure 1002, and projecting baffles 1099B provided on a surface 1017 of a movable structure 1004. As shown in FIG. 10A, baffles 1099A and baffles 1099B are interdigitated. According to some examples, interdigitated projecting baffles 1099A and 1099B may have rectangular cross-sections as shown, with each projecting baffle 1099A and 1099B having a baffle height (h–g in FIG. 10A) and a width t. Width t of adjacent projecting baffles 1099A and 1099B may be equal to or different from height (h–g). In some embodiments, projecting baffles 1099A and/or projecting baffles 1099B are not equally spaced on respective surfaces 1015 and 1017. In another embodiment, projecting baffles 1099A and/or projecting baffles 1099B are equally spaced on respective surfaces 1015 and 1017. The baffle height (which can be equal to the distance h between surface 1015 and surface 1017 minus the distance g between a top surface 1070 of each baffle 1099A and 1099B and the opposing surface (e.g., either surface 1015 or 1017)), baffle width t, and a distance p between adjacent projecting baffles 1099A and 1099B may be configured based on the properties of targeted contaminant particles. For example, the configuration of projecting baffles 1099A and 1099B can be configured specifically based on the anticipated velocity, angle of incidence, dimension, material, or weight of the contaminant particles.

According to some examples, distance p can be designed based on the relative movement of first and second structures 1002 and 1004 along, for example, the X-axis and relative rotation of first and second structures 1002 and 1004 about the Z-axis.

Another example of baffle barrier is illustrated in FIG. 10B.

FIG. 10C illustrates another example of projecting baffles 1099A provided on surface 1015 of stationary first structure 1002, and interdigitated projecting baffles 1099B provided on surface 1017 of movable second structure 1004. According to some examples, interdigitated projecting baffles 1099A and 1099B may have trapezoidal cross-sectional shapes as shown in FIG. 10C.

According to some embodiments, the configuration of projecting baffles 1099A and 1099B can be configured specifically based on the anticipated velocity, angle of incidence, dimension, material, or weight of the contaminant particles. According to some examples, distance p (distance between adjacent walls of two adjacent baffles 1099A and 1099B) can be designed based on the relative movement of first and second structures 1002 and 1004 along, for example, the X-axis and relative rotation of first and second structures 1002 and 1004 about the Z-axis.

FIG. 10D illustrates another example of interdigitated projecting baffles. As shown in FIG. 10D, baffles 1099A are provided on surface 1015 of stationary first structure 1002, and baffles 1099B are provided on surface 1017 of movable second structure 1004. According to some examples, interdigitated projecting baffles 1099A and 1099B may have a triangular cross-section shape. For example, each baffle of baffles 1099A and 1099B can have a first surface 1076 inclined relative to respective surface 1015 or 1017 by an angle $\theta_1$, and a surface 1077 included relative to respective surface 1015 or 1017 by an angle $\theta_2$. In some embodiments, angles $\theta_1$ and $\theta_2$ are equal. In some embodiments, According to some embodiments, angles $\theta_1$ and $\theta_2$ are not equal.

In some embodiments, as shown in FIGS. 10A-10D, baffles 1099A include sidewall surfaces 1076 and 1077, and baffles 1099B include sidewall surfaces 1076 and 1077. According to some examples, sidewall surface 1076 of baffles 1099A is parallel to the adjacent sidewall surface 1076 of baffles 1099B. According to some examples, sidewall surface 1077 of baffles 1099A is parallel to the adjacent sidewall surface 1077 of baffles 1099B.

In some embodiments, baffles 1099A and 1099B are disposed in areas that correspond to zones 504A discussed above with respect to FIG. 5. In some examples, substantially the entire areas corresponding to zones 504A include interdigitated projecting baffles 1099A and 1099B. Additionally or alternatively, in some examples, baffles 1099A and 1099B are disposed in areas that correspond to zones 504B discussed above with respect to FIG. 5. In some examples, substantially the entire areas corresponding to zones 504B include interdigitated baffles 1099A and 1099B.

FIGS. 10A-10D are provided as examples of interdigitated projecting baffles. However, the embodiments of this disclosure are not limited to these examples. As one example, interdigitated projecting baffles can have sinusoidal cross-sectional shapes. Additionally or alternatively, interdigitated projecting baffles can be designed similar to and/or include baffles discussed in FIGS. 12A-12H.

Interdigitated projecting baffles of FIGS. 7-9 and 10A-10D can be designed based on the velocity and direction of the movements of the particles. For example, if particles have higher velocity in the direction of X-axis (as shown, for example, in FIGS. 10A-10D), interdigitated projecting baffles are designed to have more vertical structures in the same direction. In another example, if particles have higher velocity in the direction of Z-axis (as shown, for example, in FIGS. 10A-10D), interdigitated projecting baffles are designed to have less vertical structures, and the gap h (a shown, for example, in FIGS. 10A and 10C) will be smaller.

According to some examples, interdigitated projecting baffles may be integral components of apparatuses 700 and 800. Interdigitated projecting baffles may also be attachable components that can be mounted on first and second structures as needed, in accordance with some embodiments. Attachable interdigitated projecting baffles can also be disposable, in some embodiments.

It is noted that although example designs are discussed in this disclosure, the embodiments of this disclosure are not limited to these examples. For example, the embodiments of this disclosure include any combination of the exemplary designs discussed.

Exemplary Traps for Particle Suppression

FIGS. 11A and 11B schematically depict, in cross-section, various configurations of apparatuses 1100 and 1100' having one or more traps for particle suppression, in accordance with various embodiments of the disclosure. Apparatuses 1100 and 1100' can be a reticle stage such as reticle stages 400, 500, and 600 of FIGS. 4, 5, 6A-6D, in some embodiments. Accordingly, features of apparatuses 1100 and 1100' that are similar to the features of reticle stages 400, 500, and 600 are labeled with similar reference numbers to those in FIGS. 4, 5, and 6, but prefixed with an 11 instead of a 4, 5, or 6. However, the embodiments of FIGS. 11A and 11B can be applied to other suitable components of a lithography apparatus (e.g., lithography apparatuses 100 and 100' as described in this disclosure), other particle sensitive apparatus such as metrology systems, tubes, gas flow ducts, or boxes of gas ducts/pipes, and/or any particle sensitive apparatus to reduce the number of undesired contaminant particles.

As illustrated in FIGS. 11A and 11B, apparatuses 1100 and 1100' can include a stationary first structure 1102 and a movable second structure 1104. Again, the terms stationary and movable are interchangeable and only used to describe the relative movement between structures 1102 and 1104. For example, stationary first structure 1102 can be movable, and movable second structure 1104 can be stationary. Or both structures can be movable or stationary as needed.

As depicted in FIGS. 11A and 11B, first chamber 1103 is defined, at least in part, by stationary first structure 1102 and movable second structure 1104. Apparatuses 1100 and 1100' can include one or more traps in first chamber 1103 to stop or reduce the amount of particles that can leave first chamber 1103 and pass through a gap 1114 between first and second structures 1102 and 1104.

As shown in FIG. 11A, one or more particle traps 1190 can be disposed within first chamber 1103 to capture contaminant particle with various speeds, incident angles, or other particle properties. For example, one or more particle traps 1190 can be disposed on one or more surfaces of movable second structure 1104 defining, at least in part, first chamber 1103, according to some embodiments. For example, as shown in FIG. 11A, one or more particle traps 1190 can be disposed on a surface 1159 of movable second structure 1104 defining a bottom portion of first chamber 1103, and one or more particle traps 1190 can be disposed on a surface 1161 of movable second structure 1104 defining the side portions of first chamber 603. In some embodiments, one or more particle traps 1190 disposed on surface 1161 of movable second structure 1104 can partially or substantially entirely cover surface 1161. In some embodiments, one or more particle traps 1190 disposed on surface 1159 of movable second structure 1104 can partially or substantially entirely cover surface 1161.

In some embodiments, one or more particle traps 1190 may be disposed on one or more surfaces of stationary first structure 1102 within first chamber 1103. For example, as shown in FIG. 11A, particle traps 1190 can be disposed on a surface 1115 of stationary first structure 1102 defining, at least in part, first chamber 1103. Surface 1115 faces movable second structure 1104 in some embodiments. As another example, as shown in FIG. 11A, particle traps 1190 can be disposed on a surface 1120 of stationary first structure 1102. In some embodiments, one or more particle traps 1190 disposed on surfaces 1115 and 1120 of stationary first structure 1102 can partially or substantially entirely cover surfaces 1115 and 1120. Particle traps 1190 can be disposed on surfaces of stationary first structure 1102 and movable second structure 1104 within the first chamber 1103 (and first chamber 403 of FIG. 4).

Particle traps 1190 can also be placed on other surfaces of both stationary first structure 1102 and movable second structure 1104 that are within first chamber 1103, in accordance with various embodiments. In some embodiments, as depicted in FIG. 11B, particle traps 1190 can be disposed on a surface 1157 of second structure 1104 projecting inward (e.g., toward the center of first chamber 1103) and facing surface 1159 of second structure 1104. Particle traps 1190 can also be placed on surfaces of any structure on stationary first structure 1102 or movable second structure 1104 that are within first chamber 1103.

According to some examples, during the manufacturing of apparatuses 1100 and 1100', surfaces of various parts of apparatuses 1100 and 1100' may form the mechanical structure of particle traps 1190, thus particle traps 1190 may be integral components of apparatuses 1100 and 1100'. Particle traps 1190 may also be attachable components that can be mounted on stationary first structure 1102 or movable second structure 1104 as needed, in accordance with some embodiments. Attachable particle traps 1190 can also be disposable in some embodiments. In some embodiments, upon inspection of particle traps 1190, for example, during periodic maintenance and/or upon expiration of some time limit, particle traps 1190 can be removed, and new attachable particle traps 1190 can be attached to one or more surfaces of stationary first structure 1102 and/or movable second structure 1104.

For simplicity, exemplary structural details of particle traps 1190 are not shown in FIGS. 11A and 11B, but are shown in FIGS. 12A-12E, which are discussed below.

FIGS. 12A-12L schematically depict particle trap 1290 according to various embodiments of the disclosure. Particle traps 1290 can be particle trap 1190 of FIGS. 11A and 11B, in some embodiments. However, the embodiments of FIGS. 12A-12L can be applied to other suitable components of a lithography apparatus (e.g., lithography apparatuses 100 and 100' as described in this disclosure), other particle sensitive apparatus such as metrology systems, tubes, gas flow ducts, or boxes of gas ducts/pipes, and/or any particle sensitive apparatus to reduce the number of undesired contaminant particles.

Figure 12A:
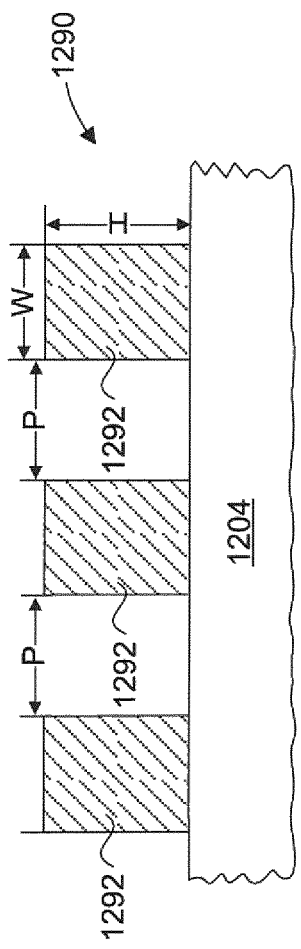
FIGS. 12A-12L schematically depict particle traps, according to various embodiments of the disclosure.
Figure 12B:
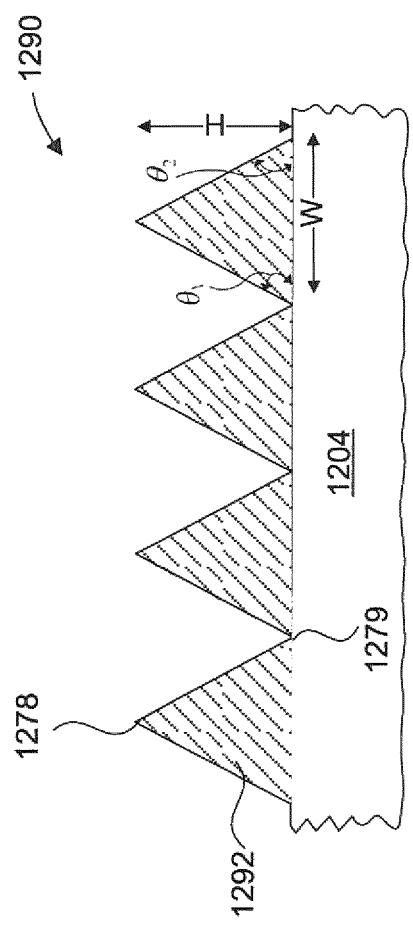

For example, FIG. 12A schematically depicts, in cross-section, particle trap 1290 according to an embodiment of the disclosure. Particle trap 1290 comprises a plurality of projecting baffles 1292. Projecting baffles 1292 are configured to restrain contaminant particles within first chamber 1103 of FIGS. 11A and 11B, preventing them from reaching gap 1114 of FIGS. 11A and 11B. Projecting baffles 1292 may also have any suitable cross-section shape, for example, near rectangular, triangular, near triangular, rhomboid, or near rhomboid. Further examples of these configurations are shown in FIGS. 12B-12H.

As shown in FIG. 12A, projecting baffles 1292 may have rectangular cross-sections, with each projecting baffle 1292 having height H and width W and spaced apart from an adjacent baffle by a distance P. The width W of projecting baffle 1292 may be equal to or different from height H. In some embodiments (not shown in FIG. 12A), baffles are spaced apart by a varying distance P—projecting baffles 1292 are not equally spaced apart. In another embodiment, projecting baffles 1292 are equally spaced—distance P is constant. For example, distance P between opposing sidewalls of adjacent projecting baffles 1292 is about 500 nm. Height H, Width W, and distance P of projecting baffles 1292 may be configured based on the properties of targeted contaminant particles. For example, the configuration of projecting baffles 1292 may vary based on the velocity, angle of incidence, dimension, material, or weight of the contaminant particles. According to some examples, width W of projecting baffles 1292 can be about 1 µm to about 20 mm. For example, width W of projecting baffles 1292 can be about 1 µm to about 1 mm. For example, width W of projecting baffles 1292 can be about 1 mm to about 20 mm. For example, width W of projecting baffles 1292 can be about 1 mm to about 5 mm. For example, width W can be about 1.5 mm to about 4.5 mm. For example, width W can be about 1.5 mm to about 2.5 mm. As another example, width W can be about 3.5 mm to about 4.5 mm. According to some examples, height H of projecting baffles 1292 of FIG. 12A can be about 1 µm to about 20 mm. For example, height H of projecting baffles 1292 of FIG. 12A can be about 1 µm to about 1 mm. For example, height H of projecting baffles 1292 of FIG. 12A can be about 1 mm to about 20 mm. For example, height H of projecting baffles 1292 of FIG. 12A can be about 1 mm to about 6 mm. An embodiment of the disclosure is expected to reduce the possibility of particles with a large range of sizes, materials, travel speeds, and angles of incidence from reaching the patterning device 412 of FIG. 4.

An exemplary operation of particle trap 1290 is explained below, with reference to FIGS. 11A, 11B, and 12A. Contaminant particles within first chamber 1103 will collide multiple times with the plurality of baffles 1292 of particle trap 1290. With each collision, the particle loses kinetic energy and losses speed, and with low enough speed or kinetic energy, the particle will stick to the surface of particle trap 1290 due to van der Waals interaction. Even if a particle has remaining energy sufficient to enter gap 1114, the particle's speed will at least be reduced, and therefore the particle is more controllable by a purge gas flow from chamber 1105 into chamber 1103. And the direction of the particle's velocity may also be changed back toward chamber 1103 due to the collisions with baffles 1292 of particle trap 1290. In an embodiment, projecting baffles 1292 can be made of materials with a high Hamaker constant to increase the van der Waals force between contaminant particles and surfaces of particle trap 1290, increasing the probability that the contaminant particles stick to the surfaces of trap 1290. Additionally, the plurality of baffles of particle trap 1290 can increase a surface area, which in turn increases the probability that the contaminant particles will be caught by particle trap 1290.

Figure 12C:
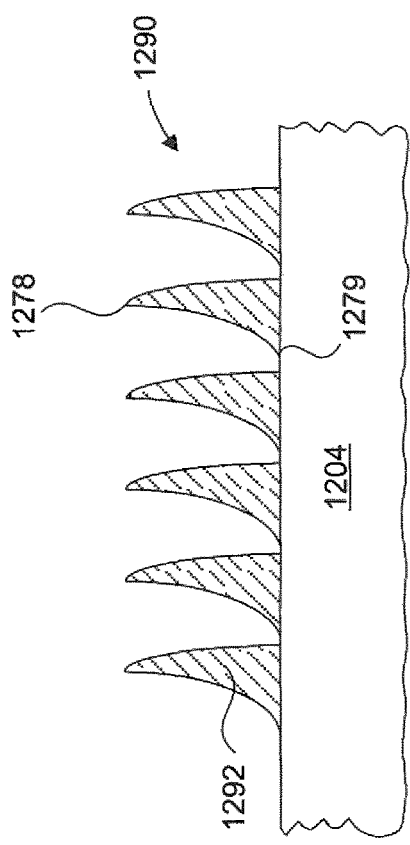
Figure 12D:
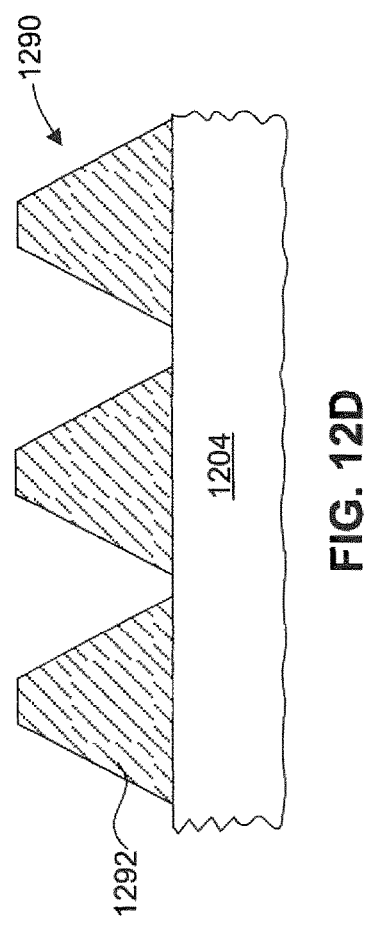
Figure 12E:
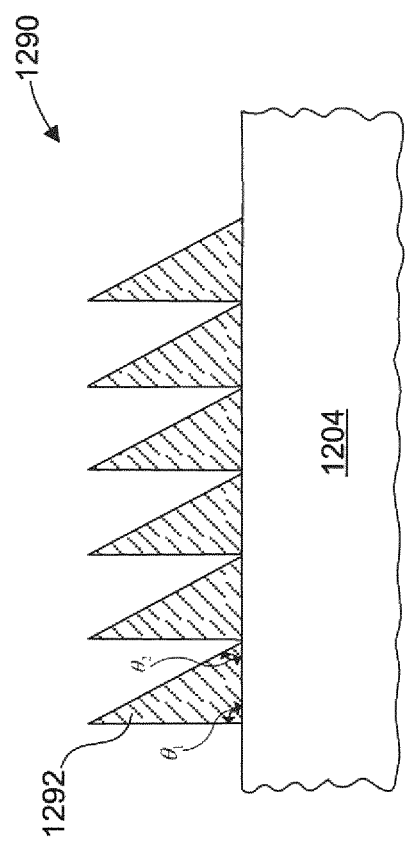
Figure 12F:
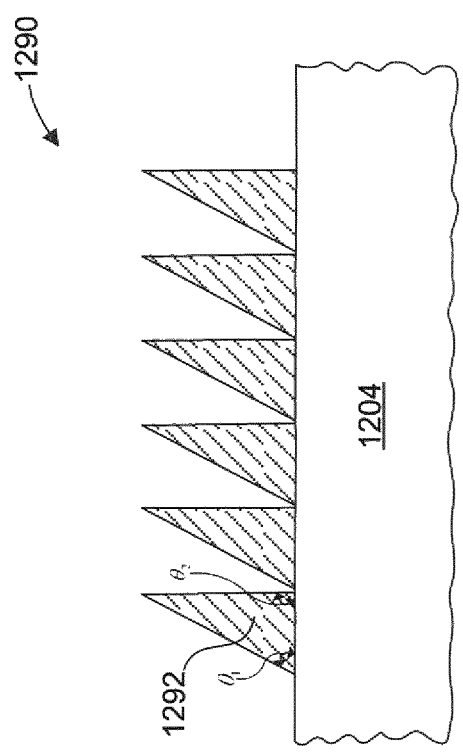

As shown in FIGS. 12B and 12E-12H, projecting baffles 1292 may have a triangular cross-section area, with each projecting baffle 1292 having height H and width W, in accordance with an embodiment. For illustration purposes, each projecting baffle 1292 has peak 1278 and trough 1279 which are the highest and lowest points, respectively, of the triangular cross-section areas. Projecting baffles 1292 may also have a near-triangular cross-section area as shown in FIG. 12C, which is configured to reflect particles a desired travel direction, for example, from second chamber 405 housing patterning device 412. Or for example, projecting baffles 1292 can have a trapezoidal cross-section as shown in FIG. 12D.

Turning back to FIG. 12B, projecting baffles 1292 may have height H and width W. According to some examples, width W of projecting baffles 1292 can be about 1 mm to about 5 mm. For example, width W can be about 1.5 mm to about 4.5 mm. For example, width W can be about 2 mm. As another example, width W can be about 4 mm. According to some examples, height H of projecting baffles 1292 of FIG. 12B can be about 1 mm to about 6 mm. For example, height H can be about 2 mm to about 5 mm. For example, height H can be about 2.4 mm to about 4.5 mm. These dimensions are provided as examples and other dimensions can be used.

Baffles 1292 can also have angles $\theta_1$ and $\theta_2$ defined by an imaginary line between adjacent troughs and the projecting surface of baffles 1292. In one example, as shown FIG. 12B, angles $\theta_1$ and $\theta_2$ are equal. In another example, as shown in FIGS. 12E-12H, angles $\theta_1$ and $\theta_2$ are not equal. For example, in FIG. 12E, angle $\theta_1$ may be about 90°, while angle $\theta_2$ is less than about 90°. For example, in FIG. 12F, angle $\theta_2$ may be about 90°, while angle $\theta_1$ is less than about 90°. For example, in FIGS. 12G and 12H, angles $\theta_1$ and $\theta_2$ are non-equal acute angles.

Figure 12G:
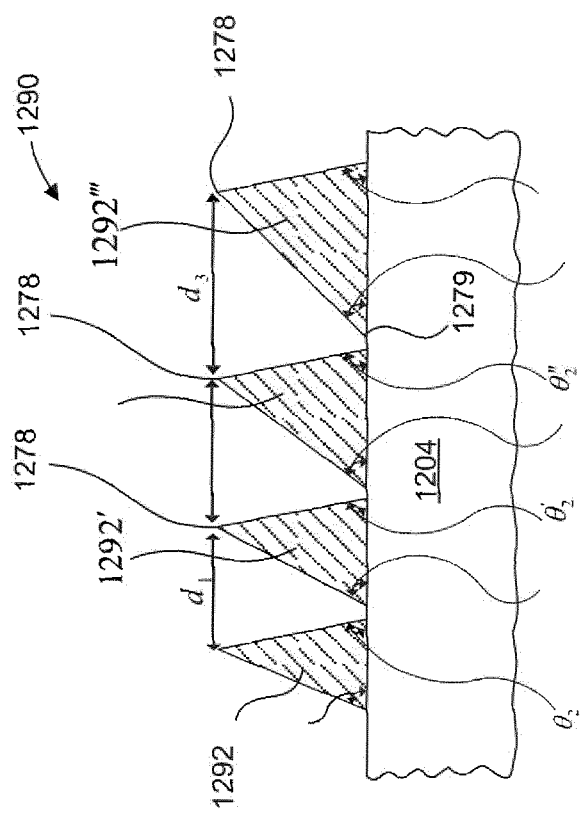

In some embodiments, angles $\theta_1$ and $\theta_2$ can vary among projecting baffles 1292. For example, as shown in FIG. 12G, angles $\theta_1$ or $\theta_2$ for a first projecting baffle 1292 can be different than the corresponding angles $\theta_1$ or $\theta_2$ for an adjacent second projecting baffle 1292'.

Figure 12H:
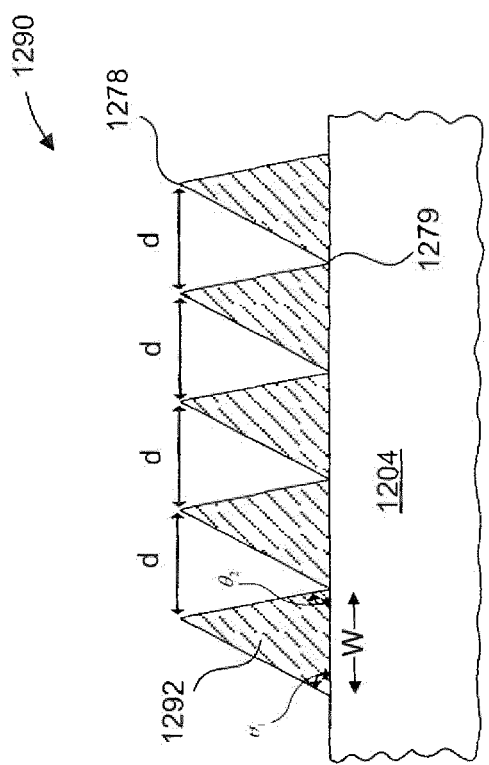

In FIG. 12H, angles $\theta_1$ and $\theta_2$ are different angles but each of the projecting baffles 1292 are substantially identical. According to some examples, angle $\theta_1$ of projecting baffle 1292 of FIG. 12H can be about 60 degrees and angles $\theta_2$ of projecting baffle 1292 of FIG. 12H can be about 30 degrees. In this example, width W of projecting baffles 1292 of FIG. 12H can be about 1.5 mm to about 4.5 mm. For example, width W of projecting baffles 1292 of FIG. 12H can be about 2 mm. As another example, width W of projecting baffles 1292 of FIG. 12H can be about 4 mm. However, these are exemplary values and angles $\theta_1$ and $\theta_2$ can take other values.

According to some embodiments, the pitch (e.g., the distance between peaks 1278 of adjacent baffles) can be fixed. Additionally or alternatively, the pitch can be variable. For example, particle trap 1290 of FIG. 12G illustrates an example where distances $d_1$, $d_2$, and $d_3$ between peaks 1278 of adjacent baffles are different. As another example, particle trap 1290 of FIG. 12H illustrates an example where pitch d is substantially similar between the baffles.

Figure 12J:
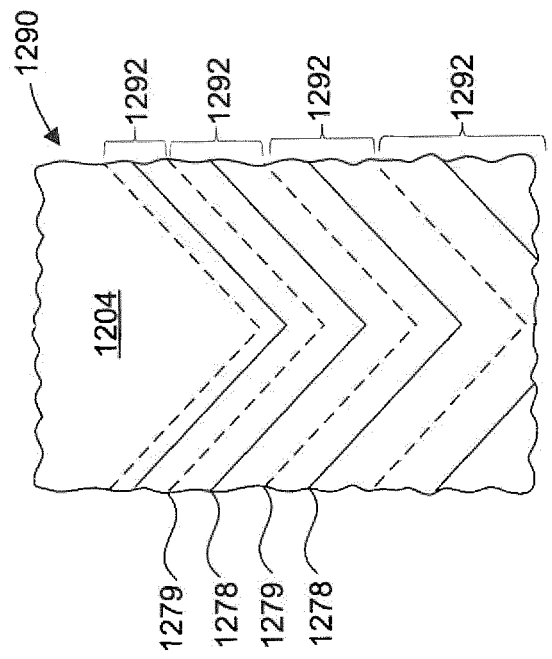
Figure 12I:
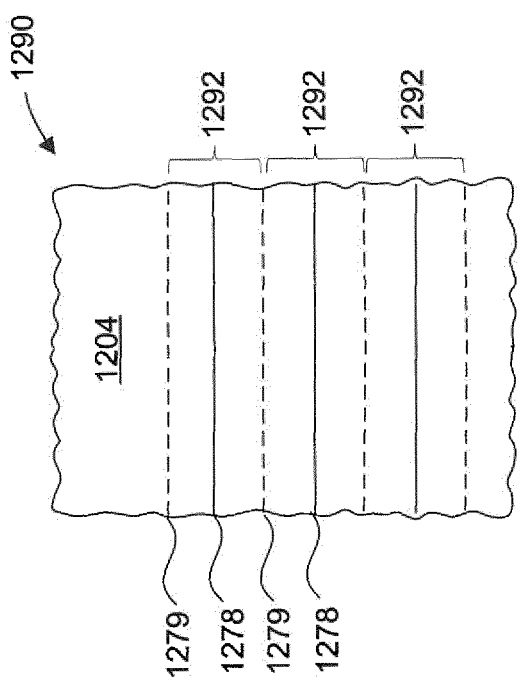

FIGS. 12I and 12J schematically depict, in plan view, various embodiments of particle traps 1290. FIG. 12I may be a plan view of particle trap 1290 described in FIG. 12B. As shown in FIG. 12I, rows of projecting baffles 1292 are parallel with each other, with equal spacing between adjacent peaks or troughs. Alternatively, each row of projecting baffles 1292 may also be arranged to form specific shapes. As shown in FIG. 12J, each row is formed into a V shape and the rows of projecting baffles 1292 are in parallel with each other, while spacing between adjacent peaks or troughs may be different. Although exemplary configurations are provided, particle traps 1290 (and their plan view) can include any other configurations such as, but not limited to, an angled or a multipronged configurations.

Figure 12K:
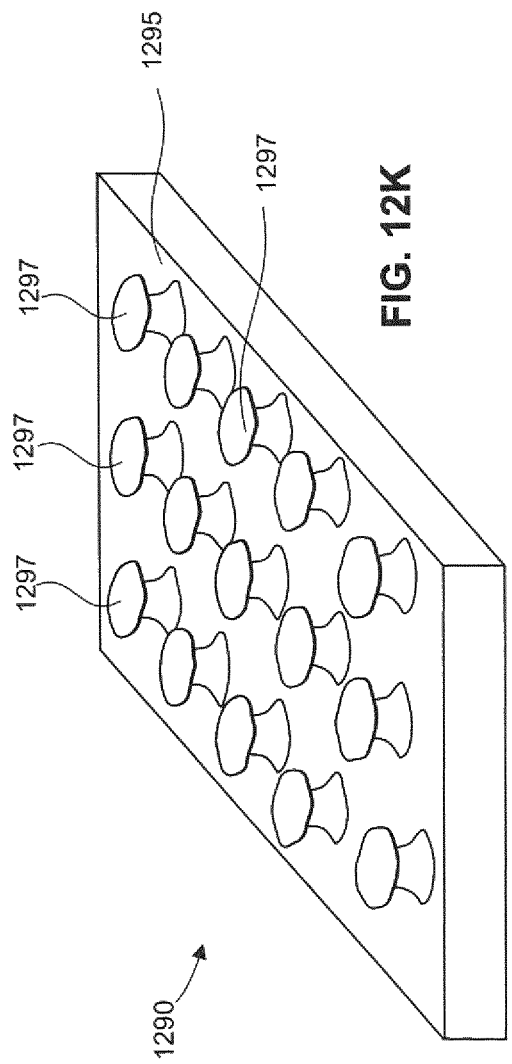

FIG. 12K schematically depicts another particle trap 1290, according to various embodiments. Particle trap 1290 of FIG. 12K can be a micro-structural tape 1295 that includes micro-structures (e.g., micro-baffles) 1297. Micro-structures 1297 can include other designs and configurations, such as, but not limited to, designs and configurations discussed in FIGS. 12A-12H. For example, micro-structures 1297 can have any suitable cross-section shape, for example, near rectangular, triangular, near triangular, rhomboid, or near rhomboid. For example, micro-structures 1297 can have a conical shape, a spherical shape, a pyramid shape, or any other suitable shape. Additionally or alternatively, micro-structures 1297 can include fractal structures to, for example, increase a surface area to catch particles. According to some examples, micro-structural tape 1295 can be made of metal. Additionally or alternatively, micro-structural tape 1295 can be made of polymer. Additionally or alternatively, micro-structural tape 95 can be made of Silicone rubber. In some examples, micro-structural tape 1295 can be coated with Nickel (Ni) such that micro-structural tape 1295 is vacuum compatible. According to some examples, micro-structural tape 1295 can include Gecko® Nanoplast® manufactured by Gottlieb Binder GmbH. However, particle trap 1290 of FIG. 12K can include any other micro-structure or nanostructure. According to some embodiments, micro-structural tape 1295 can be a removable and attachable particle trap as discussed above. As another example, particle trap 1290 of FIG. 12K can include a micro-structure that can be bolted and unbolted to target surfaces.

Figure 12L:
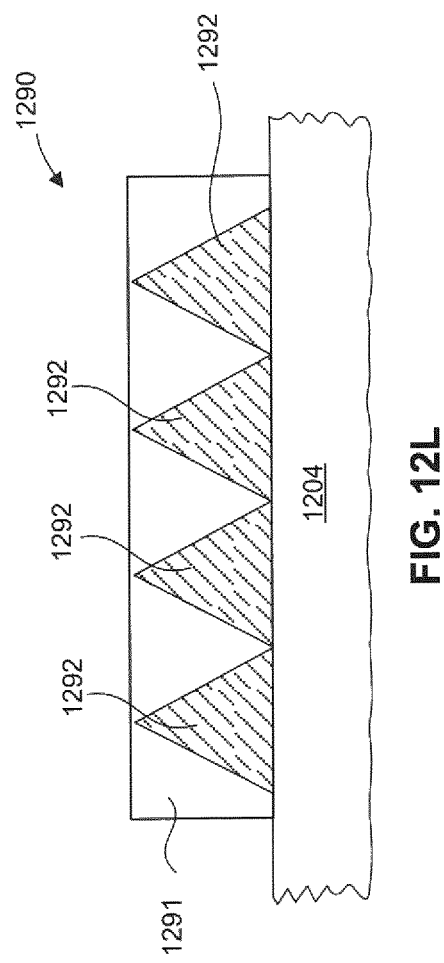

Additionally or alternatively, as illustrated in FIG. 12L, particle trap 1290 can include a micro-structure or a nano-structure (e.g., micro-baffles or nano-baffles) 1292 with material 1291 on the surface of the micro-structure or the nanostructure that is configured to allow contamination particles to adhere to particle trap 1290. For example, material 1291 can increase the sticking effect of the particle trap 1290. According to some embodiments, material 1291 can include a liquid. For example, the particle trap can include a micro-structure with liquid fixed on its surface, which can increase the sticking effect of particle trap 1290. In some examples, the micro-structure or a nanostructure 1292 includes a plurality of baffles that are impregnated with the liquid. In some examples, the liquid provided on the surface of the micro-structure can include water or oil. However, other liquid can also be used. In some examples, one end of a liquid molecule sticks to the micro-structure, and the other end of the molecule provides part of the trap for particles for particle trap 1290. Particle trap 1290 of FIG. 12L is one exemplary embodiment of micro-structure or a nanostructure with liquid, and other designs can also be used.

Each one of projecting baffles 1292 of FIGS. 12A-12J and/or micro-structure or nanostructure 1297 and 1292 of FIGS. 12K and 12L can be discrete projections protruding from surface of particle trap 1290. Additionally or alternatively, each one of projecting baffles 1292 of FIGS. 12A-12J and/or micro-structure or nanostructure 1297 and 1292 of FIGS. 12K and 12L can extend along a direction perpendicular to the surface of FIGS. 12A-12L.

Although FIGS. 12A-12L illustrate particle trap 1290 placed on movable structure 1204, as discussed above, particle trap 1290 can be placed on surfaces of stationary first structure 1102 or movable second structure 1104 that are within first chamber 1103. Further, particle traps 1190 and 1290 can be placed on surfaces of any structure on stationary first structure 1102 or movable second structure 1104 that are within first chamber 1103.

Additionally, the examples of the particle traps discussed in this disclosure can be placed within gap 414 on surface 415 of first structure 402, within gap 414 on surface 417 of second structure 404, or a combination thereof. Additionally or alternatively, the examples of the particle traps discussed in this disclosure can be placed on surfaces of first structure 402 and/or surfaces of second structure 404 located in second chamber 405. Additionally or alternatively, the examples of the particle traps discussed in this disclosure can be placed on surfaces of housing 401 facing second chamber 405.

The embodiments may further be described using the following clauses:

1. An object stage comprising:
   a first chamber;
   a second chamber;
   a first structure having a first surface;
   a second structure configured to support an object in the second chamber, movable relative to the first structure, and comprising:
      a second surface opposing the first surface of the first structure thereby defining a gap between the first structure and the second structure that extends between the first chamber and the second chamber; and
      a third surface within the first chamber; and
   a first trap disposed on at least a portion of the third surface, the first trap comprising a plurality of baffles configured to restrain contaminant particles from passing through the gap.

2. The object stage of clause 1, further comprising a second trap disposed on at least a portion of the first surface.

3. The object stage of clause 1, wherein a first distance between a first baffle and a second baffle adjacent to the first baffle is different from a second distance between the second baffle and a third baffle adjacent to the second baffle.

4. The object stage of clause 1, wherein each baffle of the plurality of baffles has a triangle cross section including a first angle defined between an imaginary line between adjacent troughs of the triangle cross section and a first projecting surface of the baffle and a second angle defined between the imaginary line between the adjacent troughs of the triangle cross section and a second projecting surface of the baffle.

5. The object stage of clause 4, wherein:
   the triangle cross section includes a first angle defined between an imaginary line between adjacent troughs of the triangle cross section and a first projecting surface of the baffle and a second angle defined between the imaginary line between the adjacent troughs of the triangle cross section and a second projecting surface of the baffle, and
   the first angle of a first baffle of the plurality of baffles is different than the first angle of a second baffle of the plurality of baffles.

6. The object stage of clause 1, wherein the first trap is attachably coupled to the third surface.

7. The object stage of clause 1, wherein the first trap comprises a micro-structural tape having the plurality of baffles projecting therefrom.

8. The object stage of clause 1, wherein the plurality of baffles are impregnated with a liquid.

9. The object stage of clause 1, wherein:
   the second structure comprises a long stroke module and a short stroke module;
   the second surface is part of the long stroke module; and
   the first structure is stationary.

10. The object stage of clause 1, wherein:
    the object is a reticle; and
    the second structure is a chuck configured to support the reticle.

11. The object stage of clause 1, wherein the first chamber and the second chamber are each configured to be held at a vacuum pressure.

12. An object stage comprising:
    a first chamber;
    a second chamber;
    a first structure having a first surface;
    a second structure configured to support an object in the second chamber, movable relative to the first structure, and comprising a second surface opposing the first surface of the first structure thereby defining a gap between the first structure and the second structure that extends between the first chamber and the second chamber; and
    a barrier disposed in the gap, and configured to restrain contaminant particles from passing through the gap.

13. The object stage of clause 12, wherein the barrier comprises:
    a first plurality of baffles projecting from the first surface; and
    a second plurality of baffles projecting from the second surface and interdigitated with the first plurality of baffles.

14. The object stage of clause 13, wherein:
    the second structure is configured to move in a scan direction; and
    each baffle of the first and second pluralities of baffles extends along the scan direction.

15. The object stage of clause 14, wherein the first and second pluralities of baffles collectively obstruct a line of sight along a direction perpendicular to the scan direction.

16. The object stage of clause 13, wherein each baffle of the first plurality of baffles comprises a surface parallel to a surface of an adjacent baffle of the second plurality of baffles.

17. The object stage of clause 13, wherein the barrier further comprises a third plurality of projecting baffles smaller than the first and second pluralities of baffles, the third plurality of projecting baffles are disposed on the first plurality of baffles, the second plurality of baffles, between the first plurality of baffles, or between the second plurality of baffles.

18. The object stage of clause 12, wherein the barrier comprises:
    a first foil coupled to the first and second surfaces at a first side of the first and second structures; and
    a second foil coupled to the first and second surfaces at a second side, opposite of the first side, of the first and second structures.

19. The object stage of clause 18, wherein:
    the second structure is configured to move in a scan direction; and
    the first and second foils are configured to roll in the scan direction.

20. The object stage of clause 18, wherein the barrier further comprises:
    a third foil, separate from the first foil, coupled to the first and second surfaces at the first side of the first and second structures; and
    a fourth foil, separate from the second foil, coupled to the first and second surfaces at the second side.

21. The object stage of clause 20, wherein:
    a portion of the third foil overlaps a portion of the first foil; and
    a portion of the fourth foil overlaps a portion of the second foil.

22. The object stage of clause 20, wherein:
a gap is formed between the third foil and the first foil; and
a gap is formed between the fourth foil and the second foil.

23. The object stage of clause 18, wherein each of the first and second foils comprises metal or a polymer.

24. The object stage of clause 12, wherein:
the second structure comprises a long stroke module and a short stroke module;
the second surface is part of the long stroke module; and
the first structure is stationary.

25. The object stage of clause 12, wherein:
the object is a reticle; and
the second structure is a chuck configured to support the reticle.

26. The object stage of clause 12, wherein the first chamber and the second chamber are each configured to be held at a vacuum pressure.

27. A lithographic apparatus configured to transfer a pattern from a patterning device onto a substrate, the lithographic apparatus comprising:
a substrate table configured to hold and move the substrate along a scanning direction;
a reticle stage configured to hold and move the reticle, the reticle stage comprising:
a first chamber;
a second chamber;
a first structure having a first surface;
a second structure configured to support the reticle in the second chamber, movable relative to the first structure, and comprising:
a second surface opposing the first surface of the first structure thereby defining a gap between the first structure and the second structure that extends between the first chamber and the second chamber; and
a third surface within the first chamber; and
a trap disposed on at least a portion of the third surface, the trap comprising a plurality of baffles configured to restrain contaminant particles from passing through the gap.

28. A lithographic apparatus configured to transfer a pattern from a patterning device onto a substrate, the lithographic apparatus comprising:
a substrate table configured to hold and move the substrate along a scanning direction;
a reticle stage configured to hold and move the reticle, the reticle stage comprising:
a first chamber;
a second chamber;
a first structure having a first surface;
a second structure configured to support the reticle in the second chamber, movable relative to the first structure, and comprising a second surface opposing the first surface of the first structure thereby defining a gap between the first structure and the second structure that extends between the first chamber and the second chamber; and
a barrier disposed in the gap, and configured to restrain contaminant particles from passing through the gap 29. The lithographic apparatus of clause 28, wherein the barrier comprises:
a first plurality of baffles projecting from the first surface; and
a second plurality of baffles projecting from the second surface and interdigitated with the first plurality of baffles.

30. The lithographic apparatus of clause 29, wherein:
the second structure is configured to move in a scan direction; and
each baffle of the first and second pluralities of baffles extends along the scan direction.

31. The lithographic apparatus of clause 30, wherein the first and second pluralities of baffles collectively obstruct a line of sight along a direction perpendicular to the scan direction.

32. The lithographic apparatus of clause 28, wherein the barrier comprises:
a first foil coupled to the first and second surfaces at a first side of the first and second structures; and
a second foil coupled to the first and second surfaces at a second side, opposite of the first side, of the first and second structures.

33. The lithographic apparatus of clause 32, wherein:
the second structure is configured to move in a scan direction; and
the first and second foils are configured to roll in the scan direction.

It is noted that although example designs are discussed in this disclosure, the embodiments of this disclosure are not limited to these examples. For example, the embodiments of this disclosure include any combination of the exemplary designs discussed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

Further, the terms "radiation" and "beam" used herein encompass all types of electromagnetic radiation, including ultraviolet (UV) radiation (for example, having a wavelength λ, of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

It should be understood that relative spatial descriptions between one or more particular features, structures, or characteristics used herein are for purposes of illustration only, and that practical implementations of the structures described herein may include misalignment tolerances without departing from the spirit and scope of the present disclosure.

While specific embodiments of the disclosure have been described above, it will be appreciated that the disclosure may be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

What is claimed is:

1. An object stage comprising:
   a first chamber;
   a second chamber;
   a first structure having a first surface;
   a second structure configured to support an object in the second chamber, movable relative to the first structure, and comprising:
      a second surface opposing the first surface of the first structure, the first surface and the second surface defining a gap therebetween that extends between the first chamber and the second chamber;
   a third surface within the first chamber; and
   a first trap disposed on at least a portion of the third surface, the first trap comprising a plurality of baffles configured to restrain contaminant particles from passing through the gap.

2. The object stage of claim 1, further comprising a second trap disposed on at least a portion of the first surface.

3. The object stage of claim 1, wherein a first distance between a first baffle and a second baffle adjacent to the first baffle is different from a second distance between the second baffle and a third baffle adjacent to the second baffle.

4. The object stage of claim 1, wherein each baffle of the plurality of baffles has a triangle cross section including a first angle defined between an imaginary line between adjacent troughs of the triangle cross section and a first projecting surface of the baffle and a second angle defined between the imaginary line between the adjacent troughs of the triangle cross section and a second projecting surface of the baffle.

5. The object stage of claim 4, wherein:
   the triangle cross section includes a first angle defined between an imaginary line between adjacent troughs of the triangle cross section and a first projecting surface of the baffle and a second angle defined between the imaginary line between the adjacent troughs of the triangle cross section and a second projecting surface of the baffle, and
   the first angle of a first baffle of the plurality of baffles is different than the first angle of a second baffle of the plurality of baffles.

6. The object stage of claim 1, wherein the first trap is attachably coupled to the third surface.

7. The object stage of claim 1, wherein the first trap comprises a micro-structural tape having the plurality of baffles projecting therefrom.

8. The object stage of claim 1, wherein the plurality of baffles are impregnated with a liquid.

9. The object stage of claim 1, wherein:
   the second structure comprises a long stroke module and a short stroke module;
   the second surface is part of the long stroke module; and
   the first structure is stationary.

10. The object stage of claim 1, wherein:
    the object is a reticle; and
    the second structure is a chuck configured to support the reticle.

11. The object stage of claim 1, wherein the first chamber and the second chamber are each configured to be held at a vacuum pressure.

12. An object stage comprising:
    a first chamber;
    a second chamber;
    a first structure having a first surface;

a second structure configured to support an object in the second chamber, movable relative to the first structure, and comprising a second surface opposing the first surface of the first structure, the first surface and the second surface defining a gap therebetween that extends between the first chamber and the second chamber; and a barrier disposed in the first chamber, and configured to restrain contaminant particles from passing through the gap.

13. The object stage of claim 12, wherein the barrier comprises:
a first plurality of baffles projecting from the first surface; and
a second plurality of baffles projecting from the second surface and interdigitated with the first plurality of baffles.

14. The object stage of claim 13, wherein:
the second structure is configured to move in a scan direction; and
each baffle of the first and second pluralities of baffles extends along the scan direction.

15. The object stage of claim 14, wherein the first and second pluralities of baffles collectively obstruct a line of sight along a direction perpendicular to the scan direction.

16. The object stage of claim 13, wherein each baffle of the first plurality of baffles comprises a surface parallel to a surface of an adjacent baffle of the second plurality of baffles.

17. The object stage of claim 13, wherein the barrier further comprises a third plurality of projecting baffles smaller than the first and second pluralities of baffles, the third plurality of projecting baffles are disposed on the first plurality of baffles, the second plurality of baffles, between the first plurality of baffles, or between the second plurality of baffles.

18. The object stage of claim 12, wherein the barrier comprises:
a first foil coupled to the first and second surfaces at a first side of the first and second structures; and
a second foil coupled to the first and second surfaces at a second side, opposite of the first side, of the first and second structures.

19. The object stage of claim 18, wherein:
the second structure is configured to move in a scan direction; and
the first and second foils are configured to roll in the scan direction.

20. The object stage of claim 18, wherein the barrier further comprises:
a third foil, separate from the first foil, coupled to the first and second surfaces at the first side of the first and second structures; and
a fourth foil, separate from the second foil, coupled to the first and second surfaces at the second side.

21. The object stage of claim 20, wherein:
a portion of the third foil overlaps a portion of the first foil; and
a portion of the fourth foil overlaps a portion of the second foil.

22. The object stage of claim 20, wherein:
a gap is formed between the third foil and the first foil; and
a gap is formed between the fourth foil and the second foil.

23. The object stage of claim 18, wherein each of the first and second foils comprises metal or a polymer.

24. The object stage of claim 12, wherein:
the second structure comprises a long stroke module and a short stroke module;
the second surface is part of the long stroke module; and
the first structure is stationary.

25. The object stage of claim 12, wherein:
the object is a reticle; and
the second structure is a chuck configured to support the reticle.

26. The object stage of claim 12, wherein the first chamber and the second chamber are each configured to be held at a vacuum pressure.

* * * * *